United States Patent
Takeuchi

(10) Patent No.: US 10,547,288 B2
(45) Date of Patent: Jan. 28, 2020

(54) RADIO FREQUENCY FRONT-END CIRCUIT AND COMMUNICATION DEVICE

(71) Applicant: Murata Manufacturing Co., Ltd., Nagaokakyo-shi, Kyoto-fu (JP)

(72) Inventor: Morio Takeuchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 93 days.

(21) Appl. No.: 15/820,553

(22) Filed: Nov. 22, 2017

(65) Prior Publication Data

US 2018/0152172 A1    May 31, 2018

(30) Foreign Application Priority Data

Nov. 25, 2016   (JP) .................................. 2016-229576
Sep. 15, 2017   (JP) .................................. 2017-177224

(51) Int. Cl.
*H03H 9/72*    (2006.01)
*H03H 9/58*    (2006.01)
*H03H 9/70*    (2006.01)

(52) U.S. Cl.
CPC .............. *H03H 9/725* (2013.01); *H03H 9/58* (2013.01); *H03H 9/706* (2013.01)

(58) Field of Classification Search
CPC .......... H03H 9/70; H03H 9/205; H03H 9/703; H03H 9/706; H03H 9/72; H03H 9/725; H04B 1/005; H04B 1/0057; H04B 1/006
USPC ...................................................... 455/73–80
See application file for complete search history.

(56) References Cited

U.S. PATENT DOCUMENTS

| | | | |
|---|---|---|---|
| 2011/0117862 A1* | 5/2011 | Bagger ................ | H04B 1/0057 455/77 |
| 2016/0127015 A1 | 5/2016 | Wloczysiak et al. | |
| 2018/0138893 A1* | 5/2018 | Caron ..................... | H03H 9/25 |
| 2018/0138930 A1* | 5/2018 | King ....................... | H04B 1/56 |

* cited by examiner

*Primary Examiner* — Lee Nguyen
(74) *Attorney, Agent, or Firm* — Keating & Bennett, LLP

(57) ABSTRACT

A radio frequency front-end circuit includes a multiplexer including filters with different pass bands and including a first acoustic wave filter and a first terminal of each of the filters being connected in common, a second acoustic wave filter including a pass band within the pass band of the first acoustic wave filter, and a switch including a common terminal connected to a second terminal of the first acoustic wave filter and selective terminals including a selective terminal connected to the second acoustic wave filter. Each of an acoustic wave resonator of the first acoustic wave filter located closest to the switch and an acoustic wave resonator of the second acoustic wave filter located closest to the switch, is a serial arm resonator.

18 Claims, 11 Drawing Sheets

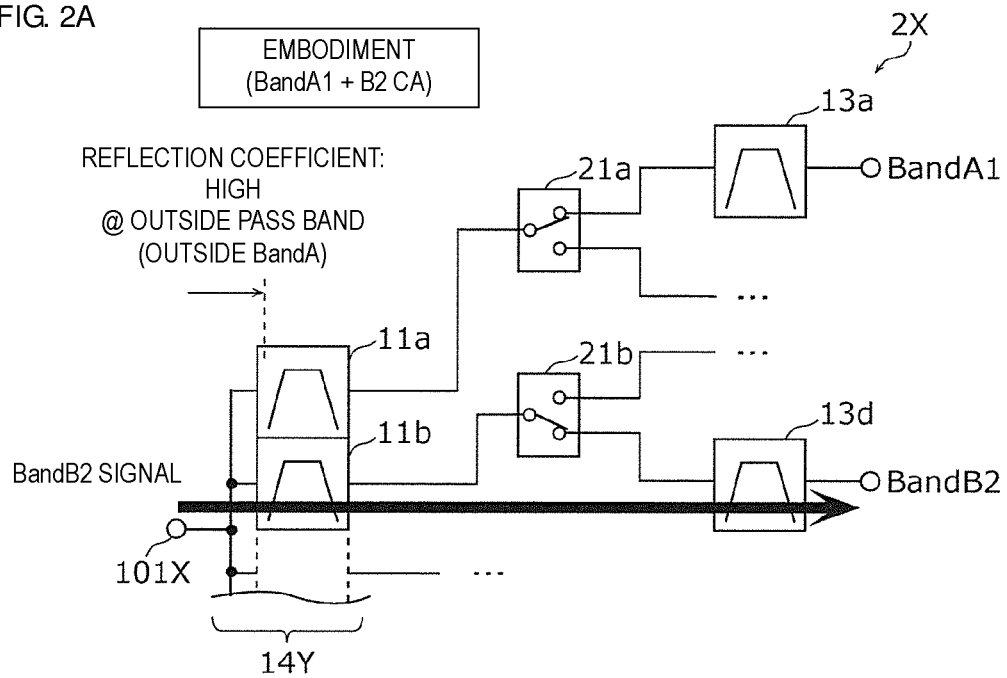
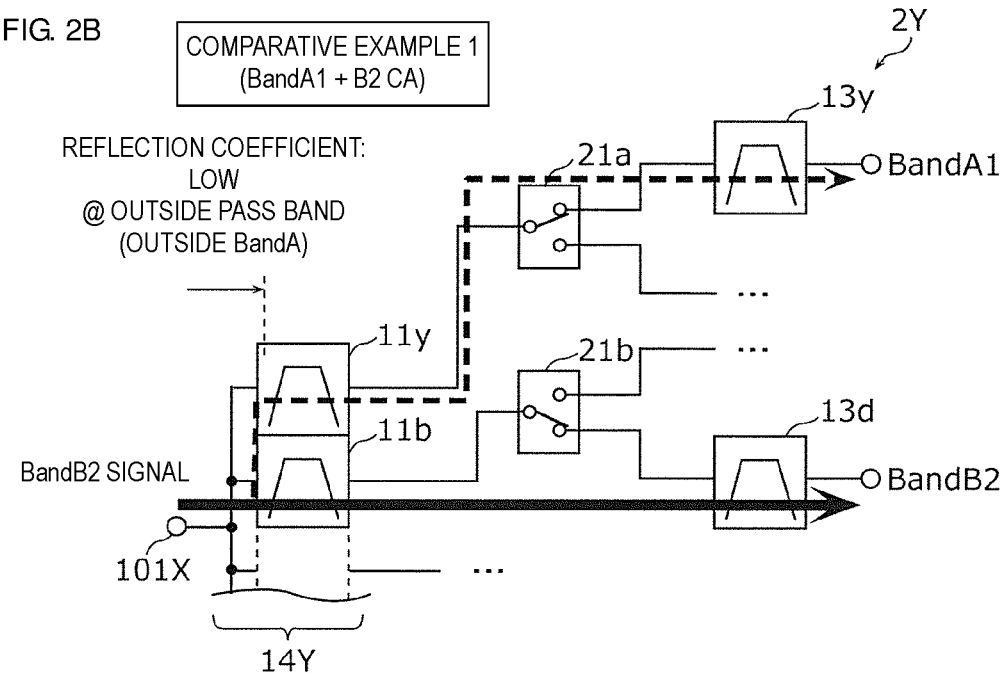

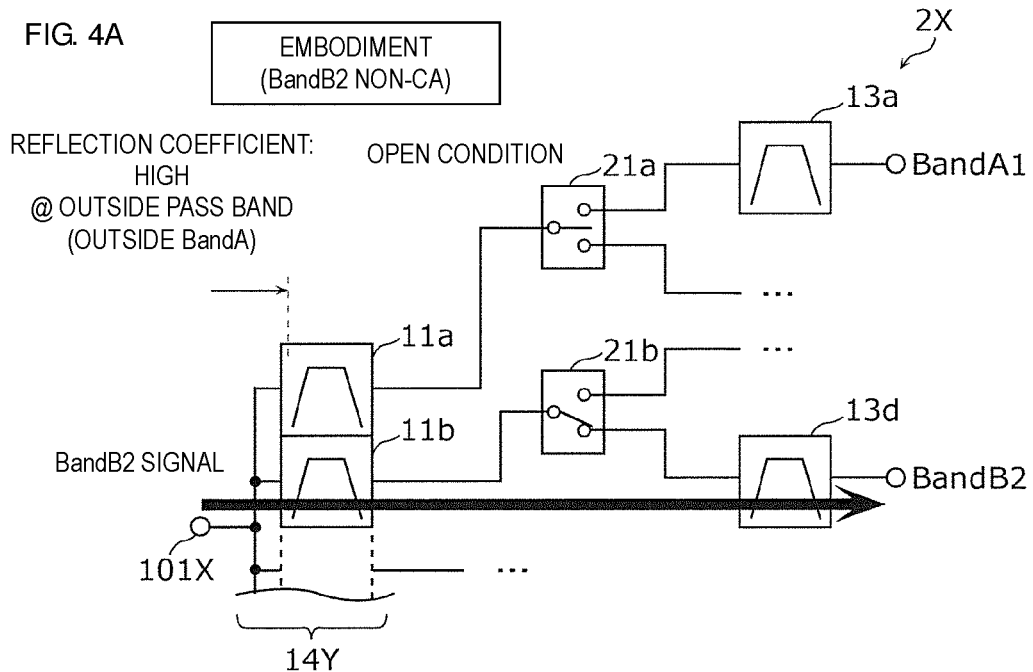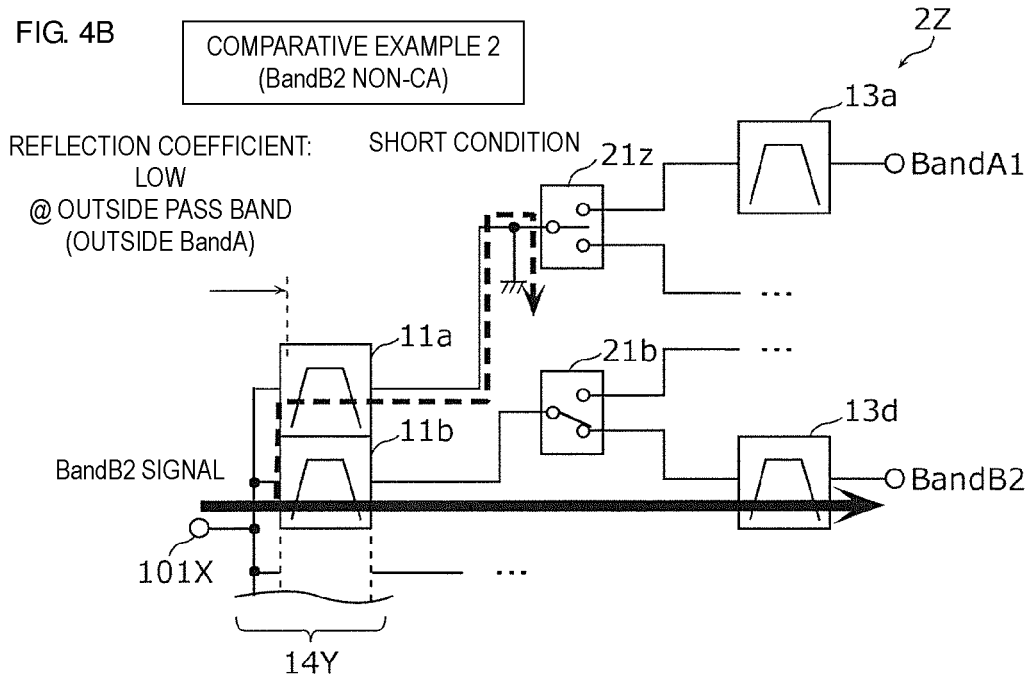

FIG. 6A

EXAMPLE
OUTPUT IMPEDANCE OF MLB/LMB FILTER
(TERMINATED WITH SERIAL ARM RESONATOR)
IN MULTIPLEXER

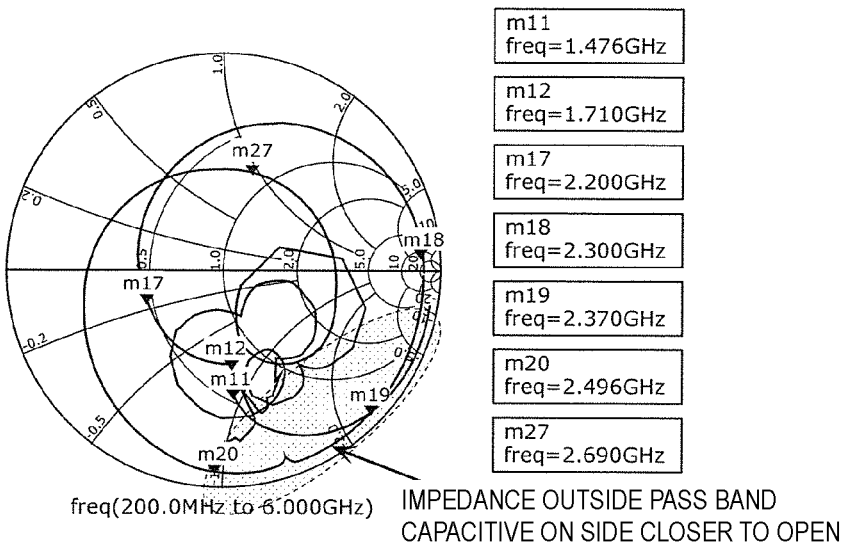

IMPEDANCE OUTSIDE PASS BAND
CAPACITIVE ON SIDE CLOSER TO OPEN

| m11 freq=1.476GHz |
| m12 freq=1.710GHz |
| m17 freq=2.200GHz |
| m18 freq=2.300GHz |
| m19 freq=2.370GHz |
| m20 freq=2.496GHz |
| m27 freq=2.690GHz |

FIG. 6B

COMPARATIVE EXAMPLE
OUTPUT IMPEDANCE OF MLB/LMB FILTER
(TERMINATED WITH SERIAL ARM RESONATOR)
IN MULTIPLEXER

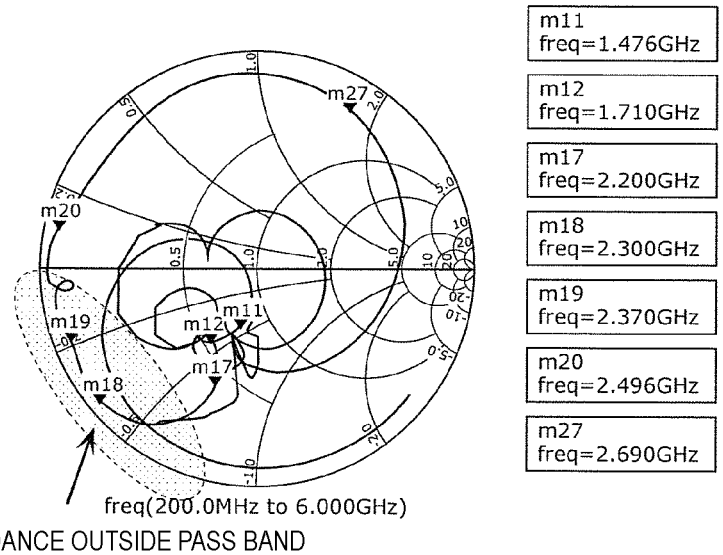

IMPEDANCE OUTSIDE PASS BAND
CAPACITIVE ON SIDE CLOSER TO SHORT

| m11 freq=1.476GHz |
| m12 freq=1.710GHz |
| m17 freq=2.200GHz |
| m18 freq=2.300GHz |
| m19 freq=2.370GHz |
| m20 freq=2.496GHz |
| m27 freq=2.690GHz |

FIG. 9

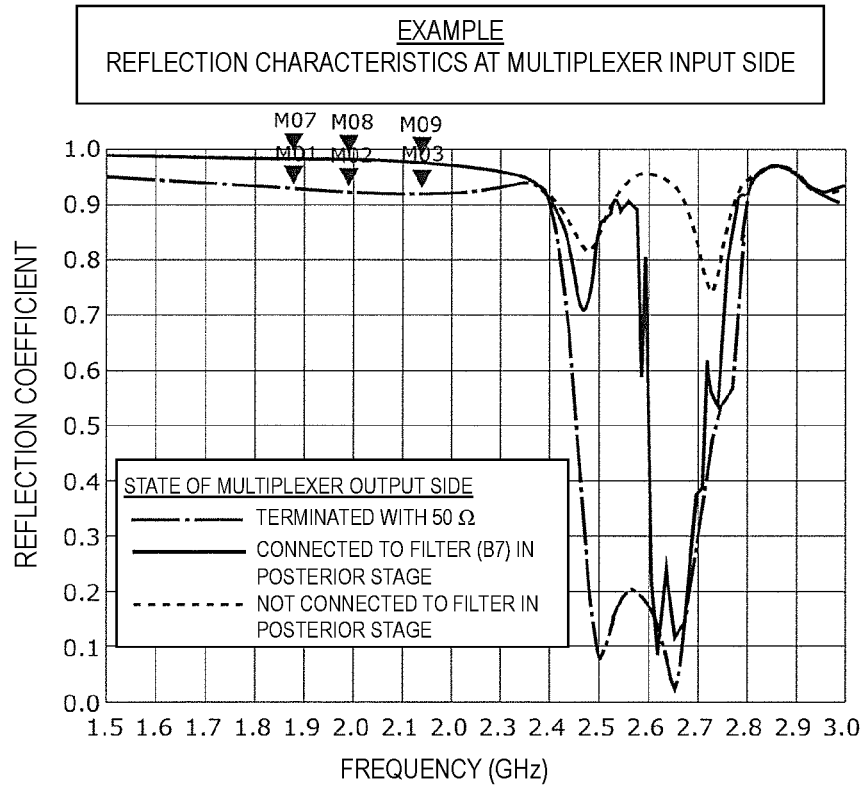

| FREQUENCY [GHz] | STATE OF MULTIPLEXER OUTPUT SIDE | | |
| --- | --- | --- | --- |
| | TERMINATED WITH 50 Ω | CONNECTED TO FILTER (B7) IN POSTERIOR STAGE | NOT CONNECTED TO FILTER IN POSTERIOR STAGE (COMMON TERMINAL OF SWITCH: OPEN CONDITION) |
| 1.880 | M01 REFLECTION COEFFICIENT = 0.930 | M04 REFLECTION COEFFICIENT = 0.983 | M07 REFLECTION COEFFICIENT = 0.984 |
| 1.995 | M02 REFLECTION COEFFICIENT = 0.925 | M05 REFLECTION COEFFICIENT = 0.980 | M08 REFLECTION COEFFICIENT = 0.981 |
| 2.140 | M03 REFLECTION COEFFICIENT = 0.921 | M06 REFLECTION COEFFICIENT = 0.975 | M09 REFLECTION COEFFICIENT = 0.975 |

| FREQUENCY [GHz] | LOSS IN MULTIPLEXER ALONE [dB] | LOSS IN FILTER ALONE [dB] | OVERALL LOSS [dB] | | LOSS IMPROVEMENT (COMPARATIVE EXAMPLE - EXAMPLE) [dB] |
|---|---|---|---|---|---|
| | | | COMPARATIVE EXAMPLE | EXAMPLE | |
| 1.805 | 1.08 | 2.03 | 2.95 | 2.81 | 0.14 |
| 1.880 | 1.14 | 2.38 | 3.45 | 3.26 | 0.19 |
| 1.830 | 1.10 | 1.56 | 2.44 | 2.29 | 0.15 |
| 1.850 | 1.11 | 2.09 | 3.00 | 2.89 | 0.11 |

RADIO FREQUENCY FRONT-END CIRCUIT AND COMMUNICATION DEVICE

CROSS REFERENCE TO RELATED APPLICATIONS

This application claims the benefit of priority to Japanese Patent Application No. 2016-229576 filed on Nov. 25, 2016 and Japanese Patent Application No. 2017-177224 filed on Sep. 15, 2017. The entire contents of these applications are hereby incorporated herein by reference.

BACKGROUND OF THE INVENTION

1. Field of the Invention

The present invention relates to a radio frequency front-end circuit including a multiplexer, and also relates to a communication device.

2. Description of the Related Art

Recently, communication devices, for example, cellular phones, have been desired to operate in a multiband mode in which the device is adaptable for a plurality of frequency bands (also simply called "bands") with one terminal. According to this a trend, radio frequency front-end circuits, for example, front-end modules, incorporated in the communication devices have also been desired to operate in the multiband mode. Such a radio frequency front-end circuit has been further desired to be adaptable for the so-called CA (carrier aggregation) in which radio frequency signals in multiple bands are transmitted and/or received at the same time or substantially the same time.

As one example of the above-mentioned radio frequency front-end circuit, a diversity module including a diplexer, a switch IC (Integrated Circuit), a plurality of BPF's (Bandpass Filters), and an LNA (Low Noise Amplifier), which are connected successively in the named order, is disclosed (see, e.g., U.S. Patent Application Publication No. 2016/0127015). The disclosed radio frequency front-end circuit is adaptable for the CA because two or more of the plurality of BPF's are selected by the switch IC.

With the related-art described above, however, when radio frequency signals in multiple bands are transmitted and/or received at the same time or substantially the same time as in the CA, the radio frequency signal in one band not only passes through a filter including a pass band corresponding to the relevant one band, but also leaks to another filter. Thus, looking at the other filter, the radio frequency signal in the band outside its own pass band leaks into the other filter, and an attenuation in the band outside the pass band of the other filter is reduced. This leads to degradation of attenuation characteristics in the other filter. Furthermore, in the one filter, the radio frequency signal in its pass band leaks out therefrom, and a loss in the relevant pass band increases. This leads to degradation of bandpass characteristics. As a result, the related-art has the problem that it is difficult to satisfactorily ensure the attenuation characteristics and the bandpass characteristics of the radio frequency front-end circuit in an overall range.

SUMMARY OF THE INVENTION

Preferred embodiments of the present invention provide radio frequency front-end circuits and communication devices in which the attenuation characteristics and the bandpass characteristics are significantly improved.

According to a preferred embodiment of the present invention, a radio frequency front-end circuit that is able to be included in a communication system that transmits, receives, or transmits and receives signals in a plurality of frequency bands at the same time or substantially the same time includes a multiplexer including a plurality of filters which include different pass bands from one another, the plurality of filters including a first acoustic wave filter and a first terminal of each of the plurality of filters being connected in common, a second acoustic wave filter including a pass band within the pass band of the first acoustic wave filter, and a switch including a common terminal connected to a second terminal of the first acoustic wave filter and a plurality of selective terminals including a selective terminal connected to the second acoustic wave filter, wherein a first acoustic wave resonator of one or more acoustic wave resonators defining the first acoustic wave filter is a serial arm resonator and is located closest to the switch among the one or more acoustic wave resonators defining the first acoustic wave filter, and a second acoustic wave resonator of one or more acoustic wave resonators defining the second acoustic wave filter is a serial arm resonator and is located closest to the switch among the one or more acoustic wave resonators defining the second acoustic wave filter.

With the features described above, when looking at the first acoustic wave filter from the switch side, an impedance at frequencies outside the pass band of the first acoustic wave filter is capacitive in a region closer to OPEN on a Smith chart. Furthermore, when looking at the second acoustic wave filter from the switch side, an impedance at frequencies outside the pass band of the first acoustic wave filter is also capacitive.

Thus, when the first acoustic wave filter and the second acoustic wave filter are connected to each other by the switch, the reflection coefficient at frequencies outside the pass band of the first acoustic wave filter is able to be increased when viewed from the side where the filters defining the multiplexer are connected in common. Accordingly, attenuation characteristics are able to be significantly improved in the first acoustic wave filter (specifically, in a path where the first acoustic wave filter is provided). Moreover, bandpass characteristics are able to be significantly improved in other one or more filters defining the multiplexer together with the first acoustic wave filter (specifically, in one or more paths where the other filters are provided).

As a result, the radio frequency front-end circuit that significantly improves the attenuation characteristics and the bandpass characteristics is able to be provided by a preferred embodiment of the present invention.

An impedance at the second terminal of the first acoustic wave filter and an impedance at a switch-side terminal of the second acoustic wave filter may be each capacitive and positioned in a right-half region of a Smith chart at frequencies outside the pass band of the first acoustic wave filter.

With the feature described above, when the first acoustic wave filter and the second acoustic wave filter are connected to each other by the switch, an impedance at frequencies outside the pass band of the first acoustic wave filter when looking at the side including the second acoustic wave filter from the second terminal of the first acoustic wave filter is able to be significantly reduced or prevented from shifting to an inductive region due to influences of not only wirings connecting the first acoustic wave filter and the second acoustic wave filter, but also the switch. In other words, it is easier to keep the above-mentioned impedance in a capacitive region. Similarly, an impedance at frequencies outside the pass band of the first acoustic wave filter when looking at the side including the first acoustic wave filter from an input terminal of the second acoustic wave filter is able to also be significantly reduced or prevented from shifting to the inductive region.

Here, the impedance at the second terminal of the first acoustic wave filter and the impedance at the switch-side terminal of the second acoustic wave filter are both capacitive at frequencies outside the pass band of the first acoustic wave filter.

Thus, the impedance when looking at the side including the second acoustic wave filter from the second terminal of the first acoustic wave filter and the impedance at the switch-side terminal of the second acoustic wave filter are both capacitive at frequencies outside the pass band of the first acoustic wave filter. Similarly, the impedance when looking at the side including the first acoustic wave filter from the switch-side terminal of the second acoustic wave filter and the output impedance of the first acoustic wave filter are both capacitive at frequencies outside the pass band of the first acoustic wave filter.

Therefore, the radio frequency front-end circuit is less susceptible to a factor causing degradation of the attenuation characteristics at frequencies outside the pass band of the first acoustic wave filter, e.g., to a reversed relation in which one impedance is inductive and the other impedance is capacitive.

As a result, the attenuation characteristics and the bandpass characteristics are able to be further significantly improved with the above-described feature.

An impedance when looking at the switch from the side including the first acoustic wave filter may be capacitive and positioned in a right-half region of a Smith chart in a non-connected state where the common terminal is not connected to any of the plurality of selective terminals.

With the feature described above, even in the non-connected state, namely even when the first acoustic wave filter and the second acoustic wave filter are not connected to each other by the switch, the attenuation characteristics and the bandpass characteristics are able to be significantly improved as in the case where those filters are connected.

In the non-connected state, an off-state capacitance value of the switch may be equal or substantially equal to a capacitance value of the second acoustic wave resonator.

With the feature described above, even in the non-connected state, the bandpass characteristics of the other filter defining the multiplexer together with the first acoustic wave filter (specifically, in a path where the other filter is provided) are able to be significantly improved to be equal or substantially equal to that in the connected state.

A capacitance value of the first acoustic wave resonator may be equal or substantially equal to a capacitance value of the second acoustic wave resonator.

With the feature described above, the impedance when looking at the first acoustic wave filter from the switch side and the impedance when looking at the second acoustic wave filter from the switch side is able to be positioned substantially in the same region or substantially the same region on the Smith chart at frequencies outside the pass band of the first acoustic wave filter. Accordingly, when the first acoustic wave filter and the second acoustic wave filter are connected to each other by the switch, the reflection coefficient at frequencies outside the pass band of the first acoustic wave filter is able to be further increased when viewed from a point at which the filters defining the multiplexer are connected in common. As a result, the attenuation characteristics and the bandpass characteristics are able to be further significantly improved.

The radio frequency front-end circuit may include the plurality of second acoustic wave filters connected individually to the plurality of selective terminals and including different pass bands from one another.

With the feature described above, the radio frequency front-end circuit is able to be applied to a larger number of bands while the attenuation characteristics and the bandpass characteristics are significantly improved.

The radio frequency front-end circuit may include a plurality of sets each including the first acoustic wave filter, the switch, and the plurality of second acoustic wave filters, and each of the plurality of first acoustic wave filters may be connected in common at a first terminal thereof, may include different pass bands from one another, and may define the multiplexer.

At least one of the first acoustic wave filter and the second acoustic wave filter may be a BAW filter.

The first acoustic wave filter may be a hybrid filter.

The plurality of filters defining the multiplexer may include an MLB/LMB filter including a pass band of about 1475.9 MHz to about 2025 MHz, an MB filter including a pass band of about 2110 MHz to about 2200 MHz, an MHB filter including a pass band of about 2300 MHz to about 2400 MHz, and an HB filter including a pass band of about 2496 MHz to about 2690 MHz.

The radio frequency front-end circuit may include a plurality of sets each including the first acoustic wave filter, the second acoustic wave filter, and the switch, each of the plurality of first acoustic wave filters may be connected in common at a first terminal thereof, may include different pass bands from one another, and may define the multiplexer, and the radio frequency front-end circuit may further include another multiplexer connected to a stage anterior to the multiplexer.

At least one of filters defining the other multiplexer may be a hybrid filter.

The other multiplexer may be a diplexer.

The other multiplexer may be a triplexer.

The triplexer may be defined by an LB filter including a pass band of about 699 MHz to about 960 MHz, an MB filter including a pass band of about 1427 MHz to about 2200 MHz, and an HB filter including a pass band of about 2300 MHz to about 2690 MHz.

The other multiplexer may be a quadplexer.

The quadplexer may be defined by an LB filter including a pass band of about 699 to about 960 MHz, an MB filter including a pass band of about 1427 MHz to about 2200 MHz, an HB1 filter including a pass band of about 2300 MHz to about 2400 MHz, and an HB2 filter including a pass band of about 2496 MHz to about 2690 MHz.

According to another preferred embodiment of the present invention, a communication device includes an RF signal processing circuit that processes radio frequency signals transmitted, received, or transmitted and received via an antenna element, and any one of the above-described radio frequency front-end circuits, the one transferring the radio frequency signals between the antenna element and the RF signal processing circuit.

With the features described above, the communication device is able to be applied to a larger number of bands while the attenuation characteristics and the bandpass characteristics are significantly improved.

As a result, the communication device that significantly improves the attenuation characteristics and the bandpass characteristics is able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a block diagram illustrating a state during CA operation in a radio frequency front-end circuit according to a preferred embodiment of the present invention.

FIG. 2B is a block diagram illustrating a state during CA operation in a radio frequency front-end circuit according to a First Comparative Example.

FIG. 4A is a block diagram illustrating a state during non-CA operation in a radio frequency front-end circuit according to a preferred embodiment of the present invention.

FIG. 4B is a block diagram illustrating a state during non-CA operation in a radio frequency front-end circuit according to the Second Comparative Example.

FIG. 6A is a Smith chart representing an output impedance of a multiplexer in a Preferred Embodiment Example.

FIG. 6B is a Smith chart representing an output impedance of a multiplexer in a Comparative Example corresponding to the Preferred Embodiment Example.

FIG. 9 is a graph representing reflection characteristics on the input side of the multiplexer in the Preferred Embodiment Example.

DETAILED DESCRIPTION OF THE PREFERRED EMBODIMENTS

Figure 1:
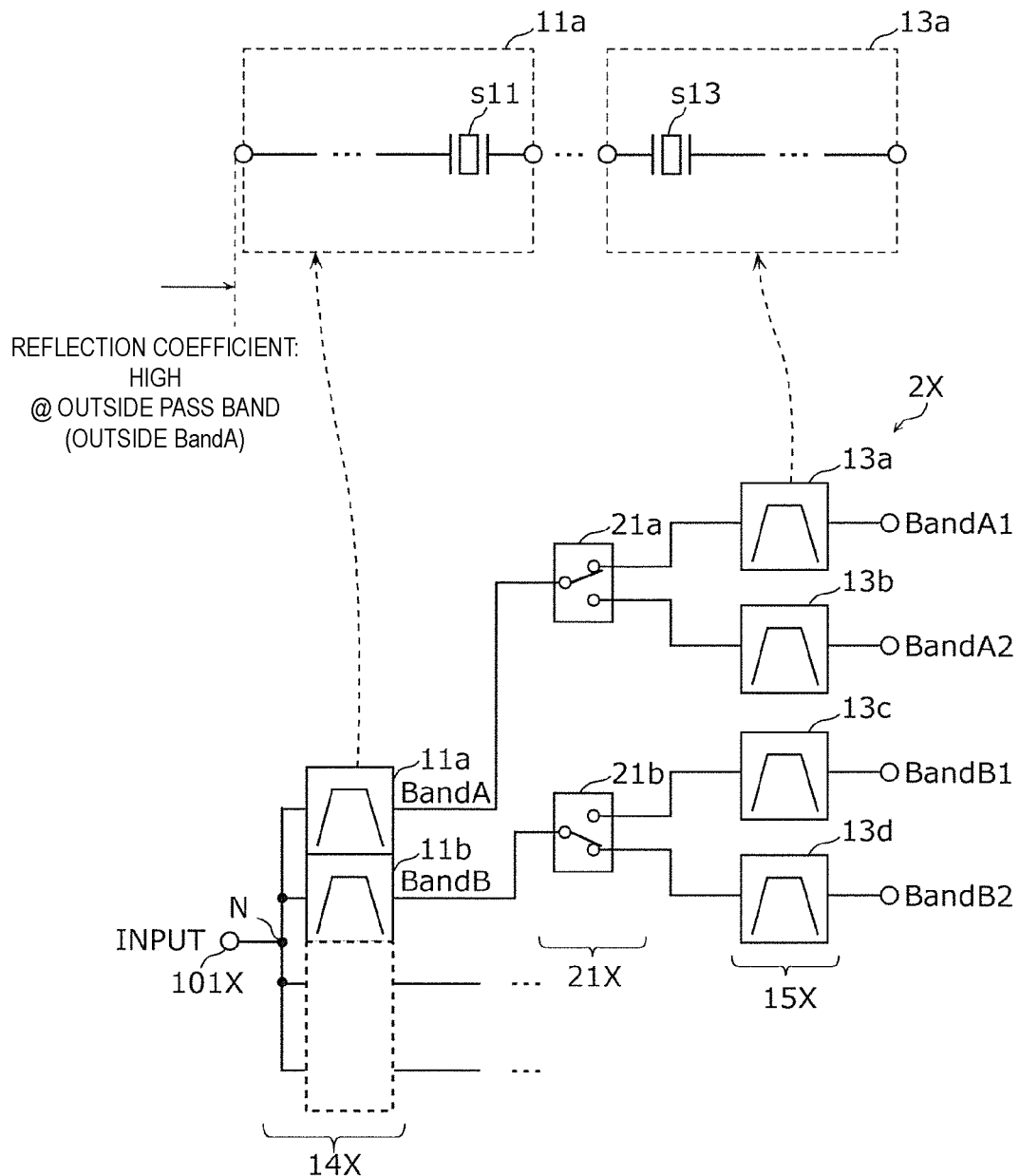
FIG. 1 is a block diagram of a radio frequency front-end circuit according to a preferred embodiment of the present invention.

Preferred embodiments of the present invention will be described in detail below with reference to Examples and drawings. It is to be noted that any of the following preferred embodiments represents a general or specific example. Thus, numerical values, shapes, materials, elements, arrangements and connections of the elements, etc., which are described in the following preferred embodiments, are merely illustrative, and they do not limit the scope of the present invention. Among the elements included in the following preferred embodiments, those not included in independent Claims are explained as being elements that are able to be optionally included.

In the drawings, substantially the same or similar elements are denoted by the same reference sings, and duplicate description of those elements is omitted or simplified in some cases.

FIG. 1 is a block diagram of a radio frequency front-end circuit 2X according to a preferred embodiment of the present invention. FIG. 1 additionally illustrates a portion of a block diagram of each of a filter 11a in an initial stage (e.g., a first acoustic wave filter) and a filter 13a in a posterior stage (e.g., a second acoustic wave filter), the filters 11a and 13a being described later.

The radio frequency front-end circuit 2X is a circuit that transfers radio frequency signals between an antenna element (not illustrated) and an RFIC (Radio Frequency Integrated Circuit, not illustrated). In an example, the radio frequency front-end circuit 2X is a radio frequency module that is located in a front-end portion of a multiband-adaptable cellular phone. The radio frequency front-end circuit 2X is able to be applied to a communication system, for example, CA, using a plurality of frequency bands at the same time or substantially the same time. The communication system, for example, CA, implies a communication method of transmitting, receiving, or transmitting and receiving signals in a plurality of frequency bands at the same time or substantially the same time.

In this preferred embodiment, the radio frequency front-end circuit 2X is in conformity with LTE (Long Term Evolution), and it transfers radio frequency signals in Bands (frequency bands) specified in 3GPP (Third Generation Partnership Project). More specifically, the radio frequency front-end circuit 2X is located in a receiving system to perform filtering, in predetermined frequency bands, of radio frequency signals that are received by the antenna element and input to an INPUT terminal 101X (e.g., received radio-frequency signals), and to output the radio frequency signals after the filtering to the RFIC from a plurality of individual terminals (for example, a Band A1 terminal, a Band A2 terminal, a Band B1 terminal, and a Band B2 terminal) via an amplifier (for example, a low noise amplifier, not illustrated).

In the description below, the "Band specified in 3GPP" is simply called "Band", and a reception band in each Band is simply denoted in some cases as follows; for example, a reception band in Band is denoted by "Band" or "B**".

An overview of the radio frequency front-end circuit according to this preferred embodiment will be given below with reference to Comparative Examples. Specific examples of the filters included in this preferred embodiment will be described later in connection with Examples.

The radio frequency front-end circuit 2X illustrated in FIG. 1 includes a plurality of filters in an initial stage (e.g., first acoustic wave filters), for example, filters 11a and 11b, a plurality of filters in a posterior stage (e.g., second acoustic wave filters), for example, filters 13a to 13d, and a plurality of switches, for example, switches 21a and 21b, located between the filters in the initial stage and the filters in the posterior stage. In other words, the radio frequency front-end circuit 2X includes a plurality (e.g., four) of sets each including the filter in the initial stage, the switch, and the plurality of filters in the posterior stage. It is to be noted that the number of the above-mentioned sets is not limited to a particular value insofar as the number is two or more, and that the number of the filters in the posterior stage is also not limited to a particular value insofar as two or more filters are included in each set. For the sake of simplicity, however, the following description is provided with attention focused on a set of the filter 11a, the switch 21a, and the filters 13a and 13b, and on a set of the filter 11b, the switch 21b, and the filters 13c and 13d among elements of the radio frequency front-end circuit 2X.

The plurality of filters in the initial stage, for example, the filters 11a and 11b, are acoustic wave filters of which one terminals (input terminals in this preferred embodiment) are connected in common, and which include different pass bands from each other. The plurality of filters in the initial stage define a multiplexer 14X that de-multiplexes or multiplexes (de-multiplexes in this preferred embodiment) radio frequency signals, and that is applied to frequency allocation in the CA, for example.

The plurality of filters in the initial stage are connected in common at a common connection point N of the multiplexer 14X (e.g., at a common terminal of the multiplexer 14X), and they are further connected to the INPUT terminal 101X of the radio frequency front-end circuit 2X via the common connection point N.

More specifically, in the filter 11a, an input terminal is connected to the INPUT terminal 101X via the common connection point N, and an output terminal is connected to the switch 21a. The filter 11a includes a pass band provided by BandA. In the filter 11b, an input terminal is connected to the INPUT terminal 101X via the common connection point N, and an output terminal is connected to the switch 21b. The filter 11b includes a pass band provided by BandB different from BandA.

Here, the "different pass bands from each other" include not only pass bands including frequency bands that are completely separate or spaced apart from each other, but also pass bands including frequency bands including at least portions overlapping with each other.

The plurality of filters in the initial stage may be connected in common at the INPUT terminal. Thus, the INPUT terminal may be the common connection point N.

The plurality of filters in the posterior stage, for example, the filters 13a to 13d, are each an acoustic wave filter including a pass band that falls within the pass band of the corresponding filter in the initial stage. In this preferred embodiment, the plurality of filters in the posterior stage each perform filtering of the radio frequency signal, which has been de-multiplexed by the multiplexer 14X, in a narrower pass band than that of corresponding one of the filters in the initial stage, which defines the multiplexer 14X. The filters in the posterior stage define a filter circuit 15X corresponding to the frequency allocation for individual Bands, for example. Each of the filters in the posterior stage includes the pass band falling within that of the filter in the initial stage, which defines the same set as the relevant filter in the posterior stage. In other words, the pass bands of the filters in the posterior stage are each included in the pass band of the filter in the initial stage, which is connectable to the relevant filter in the posterior stage by the switch. In addition, the pass bands of the filters in the posterior stage, which define the same set, are different from one another.

More specifically, in the filter 13a, an input terminal is connected to the filter 11a through the switch 21a, and an output terminal is connected to a BandA1 terminal. The filter 13a includes a pass band provided by BandA1 that is included in the pass band BandA of the filter 11a. In the filter 13b, an input terminal is connected to the filter 11a through the switch 21a, and an output terminal is connected to a BandA2 terminal. The filter 13b includes a pass band provided by BandA2 that is included in the pass band BandA of the filter 11a (although BandA2 is different from BandA1). In the filter 13c, an input terminal is connected to the filter 11b through the switch 21b, and an output terminal is connected to a BandB1 terminal. The filter 13c includes a pass band provided by BandB1 that is included in the pass band BandB of the filter 11b. In the filter 13d, an input terminal is connected to the filter 11b through the switch 21b, and an output terminal is connected to a BandB2 terminal. The filter 13d includes a pass band provided by BandB2 that is included in the pass band BandB of the filter 11b (although BandB2 is different from BandB1).

The filters in the initial stage and the filters in the posterior stage are each defined by one or more acoustic wave resonators, e.g., resonators utilizing surface acoustic waves, bulk waves, or boundary acoustic waves, for example.

In other words, the filters in the initial stage and the filters in the posterior stage may be each a SAW (Surface Acoustic Wave) filter or a BAW (Bulk Acoustic Wave) filter.

In the case of the SAW filter, the filter may include a piezoelectric substrate and an IDT (Interdigital Transducer) electrode, or by a multilayer substrate with piezoelectricity in at least a portion thereof and an IDT electrode. The phrase "multilayer substrate with piezoelectricity in at least a portion thereof" implies a substrate defined by a high-acoustic-velocity support substrate in which the acoustic velocity of a bulk wave propagating therethrough is higher than the acoustic velocity of an acoustic wave propagating through a piezoelectric thin film, a low-acoustic-velocity film which is laminated on the high-acoustic-velocity support substrate and in which the acoustic velocity of a bulk wave propagating therethrough is lower than the acoustic velocity of the acoustic wave propagating through the piezoelectric thin film, and the piezoelectric thin film laminated on the low-acoustic-velocity film. Here, the high-acoustic-velocity support substrate defines and functions as not only a high-acoustic-velocity film, but also a support substrate, which are described below.

As another example, the multilayer substrate with piezoelectricity in at least a portion thereof may be a multilayer body that is defined by a support substrate, a high-acoustic-velocity film which is provided on the support substrate and in which the acoustic velocity of a bulk wave propagating therethrough is higher than the acoustic velocity of an acoustic wave propagating through a piezoelectric thin film, a low-acoustic-velocity film which is laminated on the high-acoustic-velocity film and in which the acoustic velocity of an acoustic bulk wave propagating therethrough is lower than the acoustic velocity of the acoustic wave propagating through the piezoelectric thin film, and the piezoelectric thin film laminated on the low-acoustic-velocity film.

As still another example, the multilayer substrate with piezoelectricity in at least a portion thereof may be a multilayer body that is defined by a support substrate, a high-acoustic-velocity film which is provided on the support substrate and in which the acoustic velocity of a bulk wave propagating therethrough is higher than the acoustic velocity of an acoustic wave propagating through a piezoelectric thin film, a low-acoustic-velocity film which is laminated on the high-acoustic-velocity film and in which the acoustic velocity of a bulk wave propagating therethrough is lower than the acoustic velocity of an acoustic wave propagating through the piezoelectric thin film, and the piezoelectric thin film laminated on the low-acoustic-velocity film.

The IDT electrode is able to include an appropriate metal material, for example, Al, Cu, Pt, Au, Ag, Ti, Ni, Cr, Mo, W, or one of alloys each containing any of those metals as a main ingredient. Alternatively, the IDT electrode may include a multilayer structure including a plurality of metal films each including any of the above-mentioned metals or alloys.

The piezoelectric thin film includes any of $LiTaO_3$, $LiNbO_3$, ZnO, AlN, and PZT.

The low-acoustic-velocity film is a compound including fluorine, carbon, or boron added to silicon oxide, glass, silicon oxynitride, or tantalum oxide, or a material including any of the above-mentioned materials as a main ingredient.

The high-acoustic-velocity support substrate includes any of piezoelectric bodies, for example, aluminum nitride, aluminum oxide, silicon carbide, silicon nitride, silicon, sapphire, lithium tantalate, lithium niobate, and a quartz, or any of various ceramics, for example, alumina, zirconia, cordierite, mullite, steatite, and forsterite. As an alternative, the high-acoustic-velocity support substrate includes magnesia diamond, a material containing any of the above-mentioned materials as a main ingredient, or a material containing any of mixtures of the above-mentioned materials as a main ingredient.

The high-acoustic-velocity film includes a DLC (diamond-like carbon) film, any of piezoelectric bodies, for example, aluminum nitride, aluminum oxide, silicon carbide, silicon nitride, silicon, sapphire, lithium tantalate, lithium niobate, and a quartz, or any of various ceramics, for example, alumina, zirconia, cordierite, mullite, steatite, and forsterite. As an alternative, the high-acoustic-velocity film includes magnesia diamond, a material containing any of the above-mentioned materials as a main ingredient, or a material containing any of mixtures of the above-mentioned materials as a main ingredient.

The support substrate is able to include any of piezoelectric bodies, for example, sapphire, lithium tantalate, lithium niobate, and a quartz, or any of various ceramics, for example, alumina, magnesia, silicon nitride, aluminum nitride, silicon carbide, zirconia, cordierite, mullite, steatite, and forsterite. As an alternative, the support substrate is able to include a dielectric, for example, glass, a semiconductor, for example, silicon or gallium nitride, a resin substrate, or the like.

A film thickness of the piezoelectric thin film is preferably about 3.5 $\lambda$ or less on an assumption that a wavelength of an acoustic wave, defined by the electrode pitch of the IDT electrode, is denoted by $\lambda$. This is because a Q-value is increased under such a condition. Furthermore, under the condition of about 2.5 $\lambda$ or less, temperature characteristics (TCF=Temperature Coefficient of Frequency) are significantly improved. Moreover, under a condition of about 1.5 $\lambda$ or less, adjustment of the acoustic velocity is able to be facilitated.

A film thickness of the low-acoustic-velocity film is preferably about 2.0 $\lambda$ or less on the assumption that the wavelength of the acoustic wave, defined by the electrode pitch of the IDT electrode, is denoted by $\lambda$. By setting the film thickness of the low-acoustic-velocity film to be about 2.0 $\lambda$ or less, film stress is able to be significantly reduced and warping of a wafer is able to be significantly reduced or prevented. As a result, a rate of good products is able to be increased and characteristics of the products is able to be stabilized. By setting the film thickness of the low-acoustic-velocity film to be held in a range of about 0.1 $\lambda$ to about 0.5 $\lambda$, the electromechanical coupling coefficient is hardly changed regardless of materials of the high-acoustic-velocity film.

As to a film thickness of the high-acoustic-velocity film, because the high-acoustic-velocity film encloses an acoustic wave in both the piezoelectric thin film and the low-acoustic-velocity film, the relevant film thickness is preferably as thick as possible. By setting the film thickness of the high-acoustic-velocity film to be about 0.3 $\lambda$ or more, a degree of energy concentration at a resonant point is able to be increased to about 100%. By setting the relevant film thickness to be about 0.5 $\lambda$ or more, a degree of energy concentration at an anti-resonant point is able to also be increased to about 100%, and more satisfactory device characteristics are able to be provided.

In this connection, as illustrated on the upper side of FIG. 1, a first acoustic wave resonator of the one or more acoustic wave resonators defining the filter in the initial stage (e.g., the first acoustic wave filter), the first acoustic wave resonator being located closest to the switch, and a second acoustic wave resonator of the one or more acoustic wave resonators defining the filter in the posterior stage (e.g., the second acoustic wave filter), the second acoustic wave resonator being located closest to the switch, are each a serial arm resonator.

For example, the filter 11a includes a serial arm resonator s11 as the above-mentioned first acoustic wave resonator, and the filter 13a includes a serial arm resonator s13 as the above-mentioned second acoustic wave resonator. In other words, the serial arm resonator s11 and a common terminal of the switch 21a are connected to each other without any other acoustic wave resonator located therebetween. One of selective terminals of the switch 21a and the serial arm resonator s13 are connected to each other without any other acoustic wave resonator located therebetween. Accordingly, when the switch 21a is in a state connecting the common terminal and the one selective terminal, namely when the filter 13a is selected, the filter 11a and the filter 13a are connected to each other through the serial arm resonator s11 and the serial arm resonator s13 without any other acoustic wave filter being located therebetween.

With the features described above, in the radio frequency front-end circuit 2X according to this preferred embodiment, when the filter 13a is selected, the reflection coefficient at frequencies outside the pass band of the filter 11a (e.g., outside BandA) is able to be increased when looking at the side including the selected filter 13a from the INPUT terminal 101X. Thus, looking at the multiplexer 14X, which is defined by the plurality of filters in the initial stage, from the common connection point N, when one of the filters in the posterior stage is selected, the reflection coefficient is able to be increased at frequencies outside the pass band of the filter in the initial stage, which is connected to the relevant selected filter in the posterior stage. That point will be described in detail later with reference to Examples.

Furthermore, a capacitance value of the acoustic wave resonator (e.g., the first acoustic wave resonator), which is located closest to the switch in the filter in the initial stage, and a capacitance value of the acoustic wave resonator (e.g., the second acoustic wave resonator), which is located closest to the switch in the filter in the posterior stage, are equal or substantially equal to each other. For example, a capacitance value of the serial arm resonator s11 in the filter 11a and a capacitance value of the serial arm resonator s13 in the filter 13a are equal or substantially equal to each other.

Here, the capacitance value of the acoustic wave resonator implies a value of electrostatic capacitance of the relevant acoustic wave resonator. In other words, it implies a capacitance value at a frequency sufficiently away from a resonant point and an anti-resonant point of the relevant acoustic wave resonator. In the case of the acoustic wave resonator utilizing a surface acoustic wave, for example, the value of electrostatic capacitance of the acoustic wave resonator is able to be adjusted depending on design parameters, for example, the number of pairs and the overlap width of the IDT (interdigital transducer) electrode. The phrase "equal or substantially equal" implies not only the case where the capacitance values are exactly the same, but also the case where there is an error of about ±10% between both the values.

Each of the plurality of switches, for example, the switches $21a$ and $21b$, includes the common terminal that is connected to the other terminal (output terminal in this preferred embodiment) of the filter in the initial stage, and a plurality of selective terminals including one connected to the filter in the posterior stage (e.g., two selective terminals connected to two filters in the posterior stage, those two filters defining the same one set, in this preferred embodiment). The plurality of switches define the switch circuit $21X$, e.g., a Band select switch that selects Band of a radio frequency signal that is transferred by the radio frequency front-end circuit $2X$. The switch circuit $21X$ changes over Band of the radio frequency signal by switching over the selective terminal, which is to be connected to the common terminal, in accordance with a control signal from a control unit, for example, an RFIC. In other words, the switch circuit $21X$ changes over a transfer path of the radio frequency signal in the radio frequency front-end circuit $2X$.

In this preferred embodiment, each of the switches $21a$ and $21b$ includes one common terminal and two selective terminals. The number of the selective terminals is not limited to two, and it may be a value equal or substantially equal to or larger than the number of the filters in the posterior stage, which define the above-mentioned same one set.

More specifically, in the switch $21a$, the common terminal is connected to the output terminal of the filter $11a$, one of the selective terminals is connected to the input terminal of the filter $13a$, and the other selective terminal is connected to the input terminal of the filter $13b$. In the switch $21b$, the common terminal is connected to the output terminal of the filter $11b$, one of the selective terminals is connected to the input terminal of the filter $13c$, and the other selective terminal is connected to the input terminal of the filter $13d$.

Furthermore, in a non-connected state where the common terminal of each switch in the switch circuit $21X$ is not connected to any of the plurality of selective switches, an impedance when looking at the switch from the side including the filter in the initial stage (e.g., the side including the first acoustic wave filter) is capacitive and is positioned in a right-half region on the Smith chart. That point will be described in detail later in connection with Examples.

More specifically, in the above-mentioned non-connected state, the impedance when looking at the switch from the side including the filter in the initial stage (e.g., the side including the first acoustic wave filter) is equal or substantially equal to a capacitance value of the acoustic wave resonator (e.g., the second acoustic wave resonator) located closest to the switch in the filter in the posterior stage, which is to be connected to the relevant switch. For example, in the non-connected state of the switch $21a$, an impedance when looking at the switch $21a$ from the filter $11a$ is equal or substantially equal to that of the second acoustic wave resonators in the filters $13a$ and $13b$ in the posterior stage. Stated in another way, in the non-connected state, an off-state capacitance value of the switch $21a$ is equal or substantially equal to the capacitance value of the second acoustic wave resonator. Thus, assuming that, in the non-connected state, the impedance of the switch $21a$ is denoted by Z, and a resistance value and an off-state capacitance value in an equivalent circuit of the switch $21a$ is denoted by R and C, respectively, Z is able to be expressed by the following formula with respect to R and C.

$$Z=R+(1/j\omega C)$$

Here, because of $|R|<<|1/j\omega C|$, the impedance of the switch $21a$ is dominantly determined depending on the off-state capacitance value. Accordingly, the impedance when looking at the switch $21a$ from the filter $11a$ in the non-connected state is equal or substantially equal to the off-state capacitance value of the switch $21a$.

Although the radio frequency front-end circuit $2X$ has been described above, the features and elements are not limited to those the described above. In another example, the radio frequency front-end circuit $2X$ may be included in a transmission system. In such a case, the above-described INPUT terminal $101X$ is an OUTPUT terminal from which a radio frequency signal (transmitted radio-frequency signal in this case) is output. Thus, the radio frequency front-end circuit $2X$ may perform filtering, in predetermined frequency bands, of radio frequency signals, which are input to individual terminals (for example, the BandA1 terminal, the BandA2 terminal, the BandB1 terminal, and the BandB2 terminal) after being output from the RFIC and being amplified by an amplifier (e.g., a power amplifier), and may output the radio frequency signals after the filtering to the antenna element through the OUTPUT terminal.

The operation of the radio frequency front-end circuit $2X$ according to this preferred embodiment will be described below with respect to the switches defining the switch circuit $21X$.

In accordance with control signals from the control unit (not illustrated), for example, the RFIC, the radio frequency front-end circuit $2X$ operates as follows.

The switch circuit $21X$ changes over a first connection mode in which two or more among the plurality of filters in the posterior stage defining the filter circuit $15X$ are selected, and a second connection mode in which only one among the plurality of filters in the posterior stage defining the filter circuit $15X$ is selected.

In this preferred embodiment, the switch circuit $21X$ comes into the first connection mode when a CA operation is performed on two Bands, namely on Band included in a pass band of one among the plurality of filters in the initial stage defining the multiplexer $14Y$ and Band included in a pass band of another one of those filters in the initial stage. Thus, during the CA operation, in each of two or more among the plurality of switches defining the switch circuit $21X$, the common terminal is connected to any one of the selective terminals, and the two or more among the filters in the posterior stage are selected.

FIG. 2A is a block diagram illustrating a state during the CA operation in the radio frequency front-end circuit $2X$ according to the present preferred embodiment. FIG. 2A further schematically illustrates a radio frequency signal in BandB2 ("BandB2 SIGNAL" in FIG. 2A) during the CA operation performed on BandA1 and BandB2. That point is similarly applied to FIG. 2B.

In that state, as illustrated in FIG. 2A, the filter $13a$ is selected by the switch $21a$, and the filter $13d$ is selected by the switch $21b$.

In this preferred embodiment, as described above, the serial arm resonator $s11$ is included in the filter $11a$ on the side closest to the switch $21a$, and the serial arm resonator s13 is included in the filter 13a on the side closest to the switch 21a. Therefore, when the filter 13a is selected, the reflection coefficient at frequencies outside the pass band of the filter 11a (outside BandA) is high when looking at the side including the selected filter 13a from the INPUT terminal 101X. Accordingly, the radio frequency signal in BandB2, input to the INPUT terminal 101X, is less apt to leak toward the filter 11a, and it mainly passes through the filter 11b.

FIG. 2B is a block diagram illustrating a state during the CA operation in a radio frequency front-end circuit 2Y according to Comparative Example 1.

The radio frequency front-end circuit 2Y according to Comparative Example 1 is different from the radio frequency front-end circuit 2X according to the present preferred embodiment in including the filters 11y and 13y instead of the filters 11a and 13a. In at least one of the filters 11y and 13y, a parallel arm resonator is located closest to the switch 21a.

In Comparative Example 1 in which the above-described reflection coefficient is low, the radio frequency signal in BandB2, input to the INPUT terminal 101X, leaks toward the filter 11a.

More specifically, in Comparative Example 1, because the reflection coefficient at frequencies outside the pass band of the filter 11a (outside BandA) is low when looking at the side including the selected filter 13a from the INPUT terminal 101X, the radio frequency signal in BandB2, input to the INPUT terminal 101X, leaks toward the filter 11a.

Thus, with the radio frequency front-end circuit 2Y according to Comparative Example 1, in the filter 13y, attenuation characteristics degrade due to the radio frequency signal in BandB2 outside the pass band of the filter 13y leaking into the filter 11y, and due to an attenuation at frequencies outside the pass band thereof (e.g., outside BandA1) being reduced. Furthermore, in the filter 13d, bandpass characteristics degrade due to the radio frequency signal in the pass band of the filter 13d, e.g., BandB2, leaking out therefrom, and due to a loss within the relevant pass band (BandB2) increasing. As a result, it is difficult for the radio frequency front-end circuit 2Y according to Comparative Example 1 to ensure satisfactory attenuation characteristics and satisfactory bandpass characteristics of the radio frequency front-end circuit 2Y in the overall range during the CA operation.

In contrast, with the radio frequency front-end circuit 2X according to the present preferred embodiment, in the filter 13a, the radio frequency signal in BandB2 outside the pass band of the filter 13a is significantly reduced or prevented from leaking to the filter 13a, and thus an attenuation at frequencies outside the pass band of the filter 13a (e.g., outside BandA1) is able to be significantly improved (e.g., significantly increased). Furthermore, in the filter 13d, the radio frequency signal in the pass band BandB2 of the filter 13d is significantly reduced or prevented from leaking out therefrom, and thus a loss within the pass band (BandB2) is able to be significantly improved (e.g. significantly reduced or prevented). As a result, the radio frequency front-end circuit 2X according to this preferred embodiment is able to significantly improve the attenuation characteristics and the bandpass characteristics during the CA operation in comparison with the radio frequency front-end circuit 2Y according to Comparative Example 1.

In this preferred embodiment, the switch circuit 21X comes into the above-mentioned second connection mode when the CA operation is not performed. Thus, during non-CA operation, the common terminal is connected to any one of the selective terminals in only one among the plurality of switches defining the switch circuit 21X, and the other switches are held in a non-connected state where the common terminal is not connected to any of the selective terminals. Accordingly, only one among the filters in the posterior stage is selected.

The switches defining the switch circuit 21X in the present preferred embodiment will be described below, taking the switch 21a as an example. The other switches include similar features and elements as the switch 21a except that the number of the selective terminals is different in some switches, and hence description of the other switches is omitted.

Figure 3A:
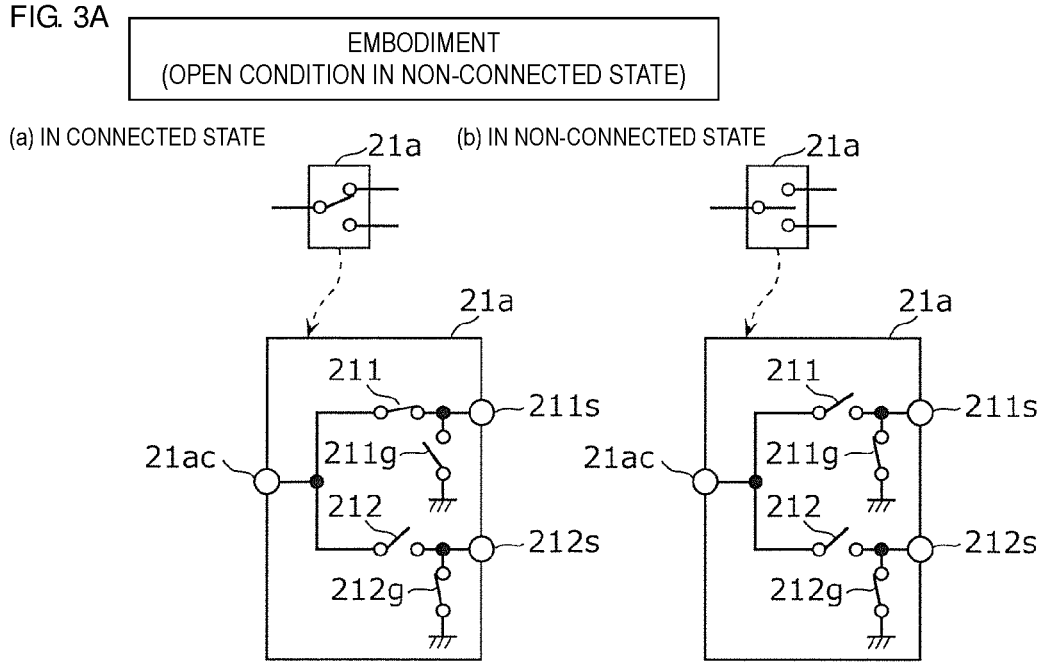
FIG. 3A is a circuit diagram illustrating a switch in a preferred embodiment of the present invention.

FIG. 3A is a circuit diagram illustrating the switch 21a in the present preferred embodiment. More specifically, (a) in FIG. 3A illustrates a connected state where a common terminal 21ac is connected to one of the selective terminals 211s and 212s (to the selective terminal 211s), and (b) in FIG. 3A illustrates a non-connected state where the common terminal 21ac is not connected to any of the selective terminals 211s and 212s.

As illustrated in FIG. 3A, the switch 21a includes a main switch 211 of the SPST (Single-Pole, Single-Throw) type, which switches over connection (conduction) and non-connection (non-conduction) between the common terminal 21ac and the selective terminal 211s with an on-off operation. The switch 21a further includes a sub-switch 211g of the SPST type, which switches over connection and non-connection between the selective terminal 211s and the ground when it is turned on and off in an exclusive relation to the main switch 211. In addition, the switch 21a includes a main switch 212 of the SPST type, which switches over connection and non-connection between the common terminal 21ac and the selective terminal 212s with an on-off operation that is not restricted by the on-off operation of the main switch 211. The switch 21a still further includes a sub-switch 212g of the SPST type, which switches over connection and non-connection between the selective terminal 212s and the ground when it is turned on and off in an exclusive relation to the main switch 212.

The above-mentioned individual switches (e.g., the main switches 211 and 212 and the sub-switches 211g and 212g) defining the switch 21a may be each, for example, a FET (Field Effect Transistor) switch or a diode switch. Alternatively, the switch 21a may be defined as a switch IC (Integrated Circuit) including a plurality of switches. The individual switches are not limited to semiconductor switches provided on semiconductor substrates, and they may be mechanical switches including or defined by MEMS (Micro Electro Mechanical Systems).

With the switch 21a defined as described above, in the connected state illustrated in (a) in FIG. 3A, namely when the main switch 211 is turned on, the sub-switch 211g is turned off and the connection between the common terminal 21ac and the selective terminal 211s is established. On the other hand, when the main switch 211 is turned off, the sub-switch 211g is turned on, and thus the common terminal 21ac and the selective terminal 211s are disconnected and isolation is established between the common terminal 21ac and the selective terminal 211s. The above-mentioned points are similarly applied to the main switch 212 and the sub-switch 212g, which are connected to the selective terminal 212s, without being limited to the main switch 211 and the sub-switch 211g both connected to the selective terminal 211s.

Furthermore, in the non-connected state illustrated in (b) in FIG. 3A, namely when the main switches 211 and 212 are both turned off, the sub-switches 211g and 212g are both turned on, and thus the common terminal 21ac is not connected to any of the selective terminals 211s and 212s and isolation is established between the common terminal 21ac and each of the selective terminals 211s and 212s.

On that occasion, the common terminal 21ac is held in an OPEN state where it is not connected to the ground. Thus, a potential at the common terminal 21ac is given as a floating potential relative to the ground. As a result, the switch 21a in the present preferred embodiment exhibits a capacitive property when viewed from the side including the filters in the initial stage (e.g., from the side including the multiplexer 14X).

Figure 3B:
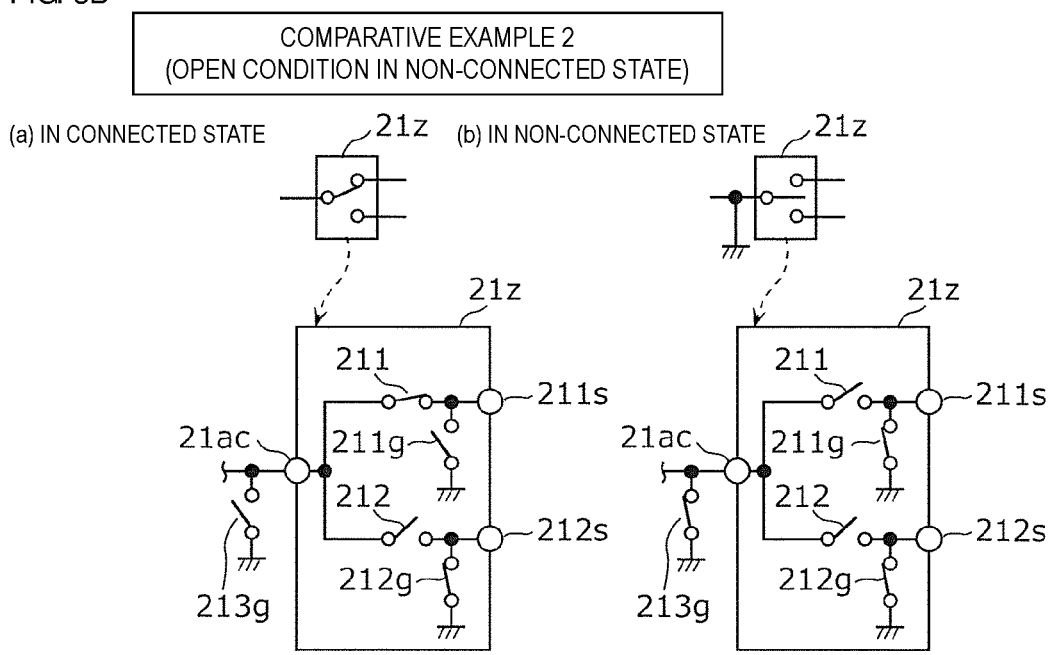
FIG. 3B is a circuit diagram illustrating a switch in a Second Comparative Example.

FIG. 3B illustrates a switch 21z in Comparative Example 2, the switch 21z in a non-connected state coming into a SHORT condition where a common terminal 21ac is connected to the ground.

FIG. 3B is a circuit diagram illustrating the switch 21z in Comparative Example 2. More specifically, (a) in FIG. 3B illustrates a connected state where the common terminal 21ac is connected to one of selective terminals 211s and 212s (to the selective terminal 211s), and (b) in FIG. 3B illustrates a non-connected state where the common terminal 21ac is not connected to any of the selective terminals 211s and 212s.

The switch 21z in Comparative Example 2 illustrated in FIG. 3B includes, unlike the switch 21a in the present preferred embodiment, a sub-switch 213g of the SPST type, which switches over connection and non-connection between the common terminal 21ac and the ground with an on-off operation. The sub-switch 213g is located outside the switch 21z.

With the switch 21z defined as described above, in the connected state illustrated in (a) in FIG. 3B, namely when the main switch 211 is turned on, the sub-switch 213g is turned off. On the other hand, in the non-connected state illustrated in (b) in FIG. 3B, namely when the main switches 211 and 212 are both turned off, the sub-switch 213g is turned on and the switch 21z is brought into a SHORT condition where the common terminal 21ac is connected to the ground.

The non-CA operation will be described below by comparing the radio frequency front-end circuit 2X according to the present preferred embodiment, which includes the above-described switch 21a, and a radio frequency front-end circuit 2Z according to Comparative Example 2, which includes the above-described switch 21z.

FIG. 4A is a block diagram illustrating a state during the non-CA operation in the radio frequency front-end circuit 2X according to the present preferred embodiment. FIG. 4B is a block diagram illustrating a state during the non-CA operation in the radio frequency front-end circuit 2Z according to Comparative Example 2. In addition, FIGS. 4A and 4B schematically illustrate a radio frequency signal in BandB2 ("BandB2 SIGNAL" in FIGS. 4A and 4B) during the non-CA operation performed on BandB2 alone. Thus, in FIGS. 4A and 4B, the switches 21a and 21z are in the non-connected state, and the filter 13d is selected by the switch 21b.

In the present preferred embodiment, as illustrated in FIG. 4A, since the common terminal 21ac of the switch 21a is in the OPEN condition (see FIG. 3A), the reflection coefficient at frequencies outside the pass band of the filter 11a (e.g., outside BandA) is increased when looking at the side including the selected filter 13a from the INPUT terminal 101X. Accordingly, the radio frequency signal in BandB2 input to the INPUT terminal 101X is less apt to leak toward the filter 11a, and it mainly passes through the filter 11b.

On the other hand, in Comparative Example 2, as illustrated in FIG. 4B, since the common terminal 21ac of the switch 21z is in the SHORT condition (see FIG. 3B), the radio frequency signal in BandB2 input to the INPUT terminal 101X leaks to the ground from the common terminal 21ac. Stated in another way, in Comparative Example 2, since the common terminal 21ac is in the SHORT condition, the reflection coefficient at frequencies outside the pass band of the filter 11a (e.g., outside BandA) is reduced when looking at the side including the selected filter 13a from the INPUT terminal 101X.

With the radio frequency front-end circuit 2Z according to Comparative Example 2, therefore, bandpass characteristics of the filter 13d degrade due to the radio frequency signal in the pass band BandB2 of the filter 13d leaking out therefrom, and due to a loss within the pass band (BandB2) increasing. As a result, it is difficult for the radio frequency front-end circuit 2Z according to Comparative Example 2 to ensure satisfactory bandpass characteristics of the radio frequency front-end circuit 2Z in the overall range during the non-CA operation.

In contrast, with the radio frequency front-end circuit 2X according to the present preferred embodiment, the radio frequency signal in the pass band BandB2 of the filter 13d is significantly reduced or prevented from leaking out from the filter 13d, and thus a loss within the pass band (BandB2) of the filter 11d is able to be significantly improved (e.g., significantly reduced or prevented). As a result, the radio frequency front-end circuit 2X according to the present preferred embodiment is able to significantly improve the bandpass characteristics during the non-CA operation in comparison with the radio frequency front-end circuit 2Z according to Comparative Example 2.

The sub-switch 213g may be located outside the switch 21a as in the switch 21z in Comparative Example 2. Similar features and effects as those described above is able to be provided by designing the sub-switch 213g to be turned off during the non-CA operation.

A detailed example of the above-described radio frequency front-end circuit 2 according to a preferred embodiment of the present invention will be described below with reference to a Preferred Embodiment Example.

Figure 5:
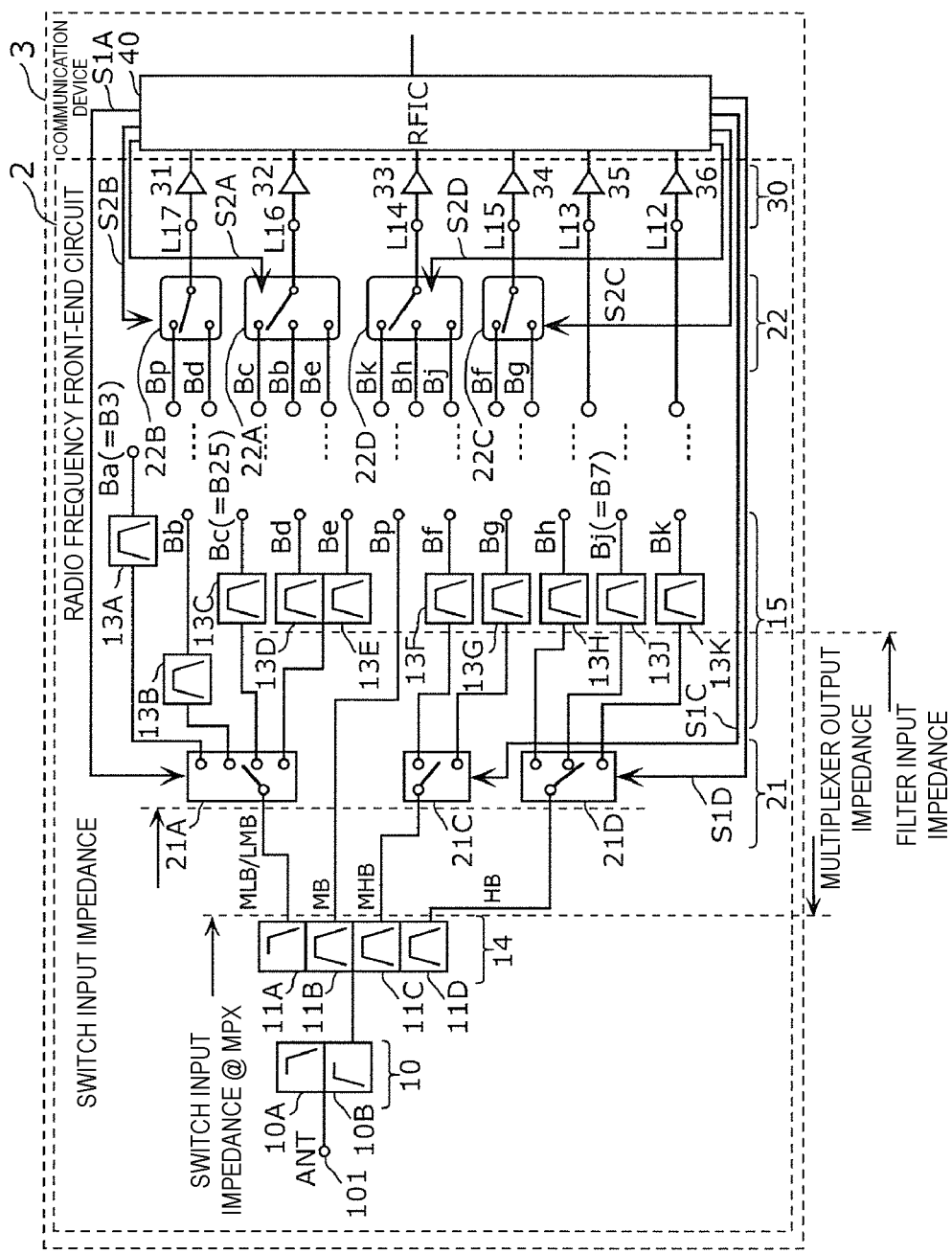
FIG. 5 is a circuit diagram of a communication device according to a preferred embodiment of the present invention.

FIG. 5 is a circuit diagram of a communication device 3 according to the present preferred embodiment. The communication device 3 illustrated in FIG. 5 is defined by a radio frequency front-end circuit 2 according to the present preferred embodiment and a radio frequency signal processing circuit (RFIC) 40.

The radio frequency front-end circuit 2 includes an antenna common terminal 101, a diplexer 10, a multiplexer 14, switch circuits 21 and 22, a filter circuit 15, and an amplifier circuit 30.

The diplexer 10 is one example of a multiplexer that is included in a stage anterior to the multiplexer 14. The diplexer 10 includes two filters with terminals connected in common at one side and including pass bands different from each other. Each of the pass bands of those two filters includes pass bands of a plurality of filters that are included in a posterior stage to define a multiplexer, for example. More specifically, the diplexer 10 is connected to the antenna common terminal 101 of the radio frequency front-end circuit 2, and it is defined by a low pass filter 10A (pass band: about 699 MHz to about 960 MHz) and a high pass filter 10B (pass band: about 1475.9 MHz to about 2690 MHz).

The multiplexer included in the stage anterior to the multiplexer 14 is not limited to the diplexer 10, and it may be one of other multiplexers, for example, a triplexer, a quadplexer, a pentaplexer, and so on. When the multiplexer is a triplexer, the triplexer is defined by an LB filter including a pass band of about 699 MHz to about 960 MHz, an MB filter including a pass band of about 1427 MHz to about 2200 MHz, and an HB filter including a pass band of about 2300 MHz to about 2690 MHz. When the multiplexer is a quadplexer, the quadplexer is defined by the LB filter including the pass band of about 699 MHz to about 960 MHz, the MB filter including the pass band of about 1427 MHz to about 2200 MHz, an HB1 filter including a pass band of about 2300 MHz to about 2400 MHz, and an HB2 filter including a pass band of about 2496 MHz to about 2690 MHz. The filters defining the multiplexer in the anterior stage may be each an LC filter, an acoustic wave filter, or a hybrid filter including an acoustic wave resonator and either one or both of L and C.

The multiplexer 14 is connected to the high pass filter 10B, and it is defined by an MLB/LMB filter 11A (about 1475.9 to about 2025 MHz), an MB filter 11B (about 2110 MHz to about 2200 MHz), an MHB filter 11C (about 2300 MHz to about 2400 MHz), and an HB filter 11D (about 2496 MHz to about 2690 MHz).

The switch circuit 21 is defined by switches 21A, 21C and 21D. The switch circuit 22 is defined by switches 22A, 22B, 22C and 22D.

The filter circuit 15 is defined by filters 13A, 13B, 13C, 13D, 13E, 13F, 13G, 13H, 13J and 13K.

The amplifier circuit is defined by LNA's 31, 32, 33, 34, 35 and 36.

The multiplexer 14 divides frequency bands of radio frequency signals into four frequency band groups. More specifically, the MLB/LMB filter 11A passes signals in Ba (band a), Bb (band b), Bc (band c), Bd (band d), and Be (band e) therethrough. The MB filter 11B passes a signal in Bp (band p) therethrough. The MHB filter 11C passes signals in Bf (band f) and Bg (band g) therethrough. The HB filter 11D passes signals in Bh (band h), Bj (band j), and Bk (band k) therethrough. Here, Ba corresponds to B3 (Band3), Bc corresponds to B25 (Band25), and Bj corresponds to B7 (Band7).

In the switch 21A, a common terminal is connected to the MLB/LMB filter 11A, and individual selective terminals are connected to the filter 13A (Ba), 13B (Bb), 13C (Bc), and 13D/13E (Bd/Be).

In the switch 21C, a common terminal is connected to the MHB filter 11C, and individual selective terminals are connected to the filter 13F (Bf) and 13G (Bg).

In the switch 21D, a common terminal is connected to the HB filter 11D, and individual selective terminals are connected to the filter 13H (Bh), 13J (Bj) and 13K (Bk).

In the switch 22B, a common terminal is connected to the LNA 31, and individual selective terminals are connected to the MB filter 11B and the filter 13D.

In the switch 22A, a common terminal is connected to the LNA 32, and individual selective terminals are connected to the filters 13C, 13B and 13E.

In the switch 22D, a common terminal is connected to the LNA 33, and individual selective terminals are connected to the filters 13K, 13H and 13J.

In the switch 22C, a common terminal is connected to the LNA 34, and individual selective terminals are connected to the filters 13F and 13G.

Here, the pass band (about 1475.9 MHz to about 2025 MHz) of the MLB/LMB filter 11A is wider than the individual pass bands of the filter 13A (Ba), 13B (Bb), 13C (Bc) and 13D/13E (Bd/Be), and includes those pass bands. The MB filter 11B (about 2110 MHz to about 2200 MHz) includes a pass band including the pass band Bp. The MHB filter 11C (about 2300 MHz to about 2400 MHz) includes a pass band wider than the individual pass bands of the filter 13F (Bf) and 13G (Bg), and includes those pass bands. The HB filter 11D (about 2496 MHz to about 2690 MHz) includes a pass band wider than the individual pass bands of the filter 13H (Bh), 13J (Bj) and 13K (Bk), and includes those pass bands.

The radio frequency signal processing circuit (RFIC) 40 is connected to output terminals of the LNA's 31 to 36, and it performs signal processing, for example, down-conversion, of a radio frequency signal, which is input from the antenna element through a received signal path for each band, and then outputs the received signal produced after the signal processing to a base-band signal processing circuit in a posterior stage. The radio frequency (RF) signal processing circuit 40 preferably is defined by an RFIC, for example. The radio frequency signal processing circuit (RFIC) 40 outputs control signals S1A, S1C, S1D, S2A, S2B, S2C and S2D to the switches 21A, 21C, 21D, 22A, 22B, 22C and 22D depending on the bands to be included. In accordance with the control signals, the switches change over connections of the signal paths.

In the communication device 3 defined as described above, the CA operation is able to be performed, for example, by switching over the switches 21A, 21C and 21D to select respective one bands from the MLB/LMB (about 1475.9 MHz to about 2025 MHz), the MB (about 2110 MHz to about 2200 MHz), the MHB (about 2300 MHz to about 2400 MHz), and the HB (about 2496 MHz to about 2690 MHz).

The radio frequency front-end circuit 2X according to the above-described preferred embodiment is able to be applied to the radio frequency front-end circuit 2 according to the Preferred Embodiment Example. In other words, the filters (e.g., the MLB/LMB filter 11A, the MB filter 11B, the MHB filter 11C, and the HB filter 11D) defining the multiplexer 14 in the Preferred Embodiment Example are each an acoustic wave filter in which a serial arm resonator is located on the side closest to the switch circuit 21. Furthermore, the filters (e.g., the filters 13A to 13H, 13J and 13K) defining the filter circuit 15 are each an acoustic wave filter in which a serial arm resonator is located on the side closest to the switch circuit 21. Moreover, impedances of the switches (e.g., the switches 21A, 21B and 21D) defining the switch circuit 21 are capacitive when viewed from the side including the filters in the initial stage (e.g., from the side including the multiplexer 14) in the non-connected state.

With the features described above, during the CA operation performed on Band3 and Band1, for example, the reflection coefficient of the MLB/LMB filter 11A at about 2496 MHz to about 2690 MHz (e.g., in the pass band of the HB filter 11D) is able to be increased. More specifically, the above-mentioned reflection coefficient of the MLB/LMB filter 11A is able to be increased to a higher level than the reflection coefficient of the HB filter 11D at about 2496 MHz to about 2690 MHz (e.g., in the pass band of the HB filter 11D).

During the non-CA operation performed on Band3 alone, the reflection coefficient of each of the MB filter 11B, the MHB filter 11C, and the HB filter 11D at about 1475.9 MHz to about 2025 MHz (e.g., in the pass band of the MLB/LMB filter 11A) is able to be increased. More specifically, the above-mentioned reflection coefficient of each of those filters is able to be increased to a higher level than the reflection coefficient of the MLB/LMB filter 11A at about 1475.9 MHz to about 2025 MHz (e.g., in the pass band of the MLB/LMB filter 11A).

With the features described above, even when the number of bands subjected to the CA operation increases, the radio frequency front-end circuit is able to be adapted for all CA combinations specified in the 3GPP standards, for example. In addition, the bands corresponding to the filter circuit 15 is able to be changed easily. Accordingly, a module including a preferred band allocation for each of delivery destinations is able to be provided with simplified circuit design.

Characteristics of the above-described radio frequency front-end circuit 2 according to the Preferred Embodiment Example will be described below in comparison with those in a Comparative Example corresponding to the Preferred Embodiment Example.

FIG. 6A is a Smith chart representing an output impedance of the multiplexer 14 in the Preferred Embodiment Example. More specifically, FIG. 6A represents an output impedance of the MLB/LMB filter 11A. FIG. 6B is a Smith chart representing an output impedance of a multiplexer in the Comparative Example corresponding to the Preferred Embodiment Example. In comparison with the multiplexer 14 in the Preferred Embodiment Example, which is terminated with the serial arm resonator (namely, the serial arm resonator is included in each filter on the side closest to the switch circuit 21), the multiplexer in the Comparative Example is different only in point of being terminated with a parallel arm resonator (namely, the parallel arm resonator is included in each filter on the side closest to the switch circuit 21). Therefore, detailed description of the multiplexer in the Comparative Example is omitted.

In FIGS. 6A and 6B, markers are additionally illustrated in the Smith charts. At the right side in the Smith chart, a frequency at each marker in the Smith chart (e.g., at a marker m* where "*" denotes a numerical value subsequent to "m" in the chart) is also indicated. The above point is similarly applied to other Smith charts referenced later.

In the Preferred Embodiment Example, as illustrated in FIG. 6A, since the MLB/LMB filter 11A is the acoustic wave filter, the output impedance of the MLB/LMB filter 11A at frequencies outside the pass band (about 1475.9 MHz to about 2025 MHz) thereof is substantially capacitive. Furthermore, since the serial arm resonator is included in the MLB/LMB filter 11A on the side closest to the switch circuit 21, the relevant output impedance is positioned closer to OPEN. Here, the phrase "closer to OPEN" implies that the impedance is positioned in a right-half region of the Smith chart.

In general, an input impedance of an acoustic wave filter includes frequency characteristics depending on frequency. Therefore, when impedance characteristics are explained with respect to a certain frequency range, for example, falling inside or outside a pass band, these characteristics are not always held over the entire relevant frequency range. Thus, for example, the phrase "the output impedance of the MLB/LMB filter 11A is positioned closer to OPEN at frequencies outside the pass band" includes not only the case where the relevant output impedance is positioned closer to OPEN at all frequencies outside the pass band, but also the case where the relevant output impedance is positioned closer to OPEN at least at a portion of frequencies outside the pass band.

More specifically, in FIG. 6A, the output impedance of the MLB/LMB filter 11A is capacitive in a region closer to OPEN at frequencies in the pass band of any one (MHB filter 11C in FIG. 6A) of the filters 11 defining the multiplexer 14 other than the MLB/LMB filter 11A.

In the Comparative Example, as illustrated in FIG. 6B, the output impedance of the MLB/LMB filter 11A at frequencies outside the pass band thereof is substantially capacitive as in the Preferred Embodiment Example. However, since the parallel arm resonator is included in the MLB/LMB filter on the side closest to the switch circuit 21, the relevant output impedance is positioned closer to SHORT. Here, the phrase "closer to SHORT" implies that the impedance is positioned in a left-half region of the Smith chart.

More specifically, in FIG. 6B, the output impedance of the MLB/LMB filter is capacitive in a region closer to SHORT at frequencies in the pass band of any one (MHB filter in FIG. 6B) of the filters defining the multiplexer in the Comparative Example other than the MLB/LMB filter.

Figure 7:
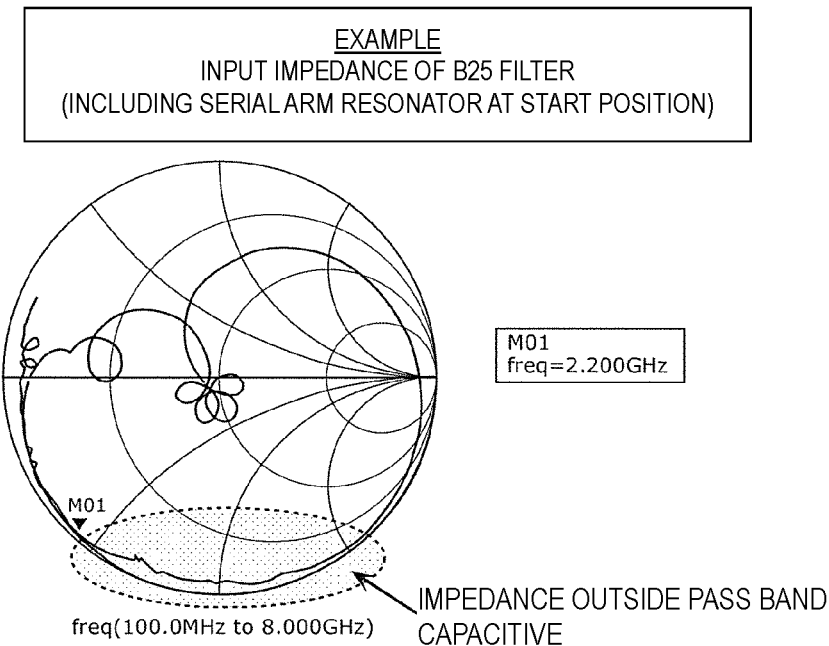
FIG. 7 is a Smith chart representing an input impedance of a filter defining a filter circuit in the Preferred Embodiment Example.

FIG. 7 is a Smith chart representing an input impedance of the filter defining the filter circuit 15 in the Preferred Embodiment Example (namely, of the filter in the posterior stage in which a resonator at the start position is a serial arm resonator). More specifically, FIG. 7 represents an input impedance of the filter 13C (Bc, also denoted by B25).

As illustrated in FIG. 7, since the filter 13C is the acoustic wave filter, the input impedance of the filter 13C at frequencies outside the pass band (about 1850 MHz to about 1915 MHz) thereof is substantially capacitive. Thus, the input impedance of the filter 13C is capacitive, specifically capacitive in a region closer to OPEN, at frequencies outside the pass band of one (MLB/LMB filter 11A) of the filters in the initial stage, the one being connected to the filter 13C by the switch circuit 21. Stated in another way, in the Preferred Embodiment Example, an impedance at the output terminal of the filter in the initial stage (e.g., at the other terminal of the first acoustic wave filter) and an impedance at the input terminal of the filter in the posterior stage (e.g., at the switch-side terminal of the second acoustic wave filter) are both capacitive and positioned in the right-half region of the Smith chart at frequencies outside the pass band of the filter in the initial stage.

Here, when the filter in the initial stage (e.g., the filter defining the multiplexer) and the filter in the posterior stage (e.g., the filter defining the filter circuit 15) are connected to each other by the switch circuit 21, an impedance when looking at the filter in the initial stage from the input side of the filter in the posterior stage is given as an impedance including a phase shifted clockwise on the Smith chart from that of the output impedance of the filter in the initial stage due to influences of the switch circuit 21 and wirings in the radio frequency front-end circuit, which connect the filter in the initial stage and the filter in the posterior stage.

In the Comparative Example, the output impedance of the filter in the initial stage is positioned in a capacitive region closer to SHORT on the Smith chart at frequencies outside the pass band of the relevant filter in the initial stage. Therefore, when the filter in the initial stage and the filter in the posterior stage are connected to each other by the switch circuit 21, an impedance at frequencies outside the pass band of the filter in the initial stage when looking at the filter in the initial stage from the input side of the filter in the posterior stage may be positioned in an inductive region due to the laid-out wirings, etc. Here, as illustrated in FIG. 7, the input impedance of the filter in the posterior stage is capacitive at frequencies outside the pass band of the filter in the initial stage. Accordingly, when the impedance at frequencies outside the pass band of the filter in the initial stage when looking at the filter in the initial stage from the input side of the filter in the posterior stage is positioned in the inductive region, the relevant impedance is in a reversed relation to the input impedance of the filter in the posterior stage at frequencies outside the pass band of the filter in the initial stage. Accordingly, with the Comparative Example, attenuation characteristics of the filter in the posterior stage may degrade at frequencies outside the pass band of the filter in the initial stage.

On the other hand, in the Preferred Embodiment Example, the output impedance of the filter in the initial stage is positioned in a capacitive region closer to OPEN on the Smith chart at frequencies outside the pass band of the relevant filter in the initial stage. Therefore, when the filter in the initial stage and the filter in the posterior stage are connected to each other by the switch circuit 21, an impedance at frequencies outside the pass band of the filter in the initial stage when looking at the filter in the initial stage from the input side of the filter in the posterior stage is more likely positioned in the capacitive region. Accordingly, with the Preferred Embodiment Example, attenuation characteristics at frequencies outside the pass band of the filter in the initial stage are able to be significantly improved in comparison with the Comparative Example.

Stated in another way, in the Preferred Embodiment Example, when the filter in the initial stage and the filter in the posterior stage are connected to each other by the switch circuit 21, the reflection coefficient at frequencies outside the pass band of the filter in the initial stage is able to be increased in comparison with that in the Comparative Example when looking at the filter in the initial stage from the input side (namely, when looking at the filter in the initial stage from the side including the common connection point). As a result, during the CA operation, attenuation characteristics in a path of one of the filters in the initial stage are able to be significantly improved while significantly improving bandpass characteristics of the other filter(s) in the initial stage.

Figure 8A:
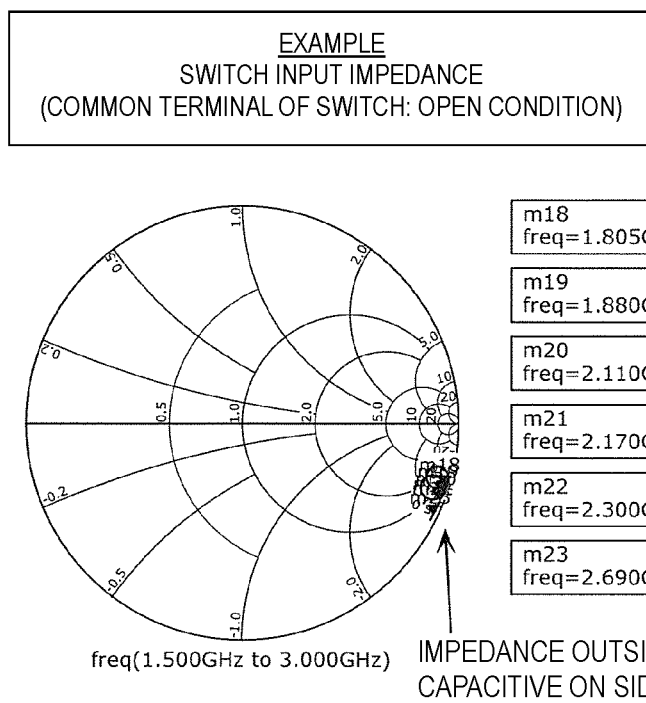
FIG. 8A is a Smith chart representing an input impedance of a switch defining a switch circuit.

FIG. 8A is a Smith chart representing an input impedance of the switch defining the switch circuit 21. More specifically, FIG. 8A represents an input impedance of the switch 21A when the common terminal of the switch 21A is in the OPEN condition, namely in the non-connected state of the switch 21A.

As illustrated in FIG. 8A, the input impedance of the switch 21A in the above-described situation is capacitive in a region closer to OPEN because the common terminal of the switch 21A is in the OPEN condition. In other words, the input impedance of the switch 21A at frequencies outside the pass band (about 1475.9 MHz to about 2025 MHz) of the MLB/LMB filter 11A to which the switch 21 is connected is capacitive in a region closer to OPEN.

Figure 8B:
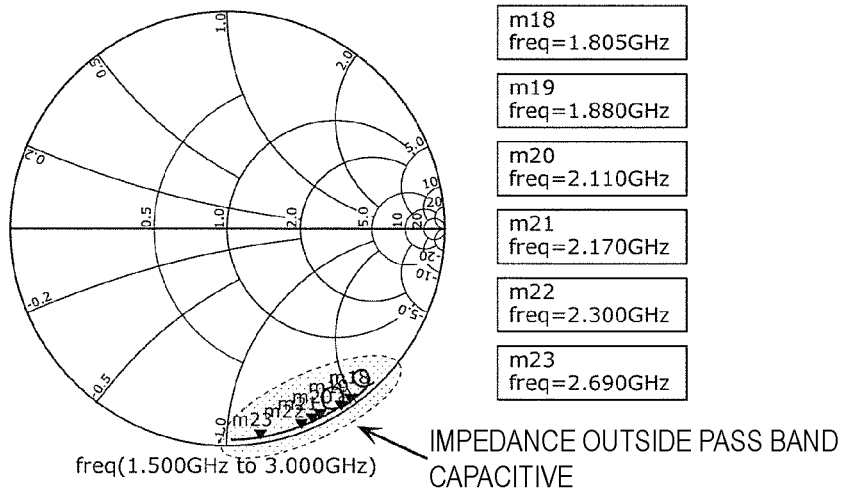
FIG. 8B is a Smith chart representing an impedance when looking at the switch side from an output terminal of the multiplexer.

Thus, an impedance when looking at the switch 21A, which has the above-described input impedance, from the output terminal of the multiplexer 14 (e.g., SWITCH INPUT IMPEDANCE @ MPX in FIG. 5) is given as illustrated in FIG. 8B.

FIG. 8B is a Smith chart representing the impedance when looking at the side including the switch 21A from the output terminal of the multiplexer 14.

As illustrated in FIG. 8B, the impedance when looking at the side including the switch 21A from the output terminal of the multiplexer 14 includes a phase shifted from that of the impedance illustrated in FIG. 8A due to the wiring connecting the multiplexer 14 and the switch 21A. More specifically, the above-mentioned phase is shifted clockwise on the Smith chart. In the Preferred Embodiment Example, since the impedance before the shift is capacitive in a region closer to OPEN, there is a sufficient margin until the impedance after the shift comes into the inductive region on the Smith chart. Therefore, the impedance after the shift is capacitive. Thus, the impedance when looking at the side including the switch 21A from the output terminal of the MLB/LMB filter 11A is capacitive at frequencies outside the pass band (about 1475.9 MHz to about 2025 MHz) of the MLB/LMB filter 11A.

As described above, when the switch defining the switch circuit 21 is in the non-connected state, the impedance when looking at the side including the relevant switch from the output terminal of the filter in the initial stage, defining the multiplexer 14, is capacitive at frequencies outside the pass band of the relevant filter in the initial stage.

Here, as illustrated in FIG. 6A, the output impedance of the filter in the initial stage, defining the multiplexer 14, is capacitive at frequencies outside the pass band of the relevant filter in the initial stage. According to the Preferred Embodiment Example, therefore, leaking-in of radio frequency signals at frequencies outside the pass band of the relevant filter in the initial stage is able to be significantly reduced or prevented to a lower level in comparison with the common terminal coming into the SHORT condition in the non-connected state.

Stated in another way, in the Preferred Embodiment Example, the reflection coefficient when looking at the filter in the initial stage from the input side (namely, when looking at the filter in the initial stage from the common connection side) is able to be increased in comparison with that in the Comparative Example at frequencies outside the pass band of the relevant filter in the initial stage when the switch defining the switch circuit is in the non-connected state. As a result, the bandpass characteristics in the path of another filter in the initial stage are able to be significantly improved during the non-CA operation.

A practical effect of significantly improving the bandpass characteristics with the radio frequency front-end circuit 2 according to the Preferred Embodiment Example will be described below with reference to exemplary numerical values.

FIG. 9 is a graph representing reflection characteristics on the input side of the multiplexer 14 in the Preferred Embodiment Example. More specifically, FIG. 9 represents reflection characteristics at the input terminal of the multiplexer 14 when the output side of the multiplexer 14 is defined by any one of the following cases (i) to (iii):

(i) Terminated with 50 Ω;

(ii) Connected to the filter (filter 13J (B7)) in the posterior stage; and (iii) Connected to the switch 21D with the common terminal being in the OPEN condition.

Here, the cases (ii) and (iii) are different from the case (i) only in that the filter in the posterior stage or the switch 21D is connected to the HB filter 11D defining the multiplexer 14.

In FIG. 9, markers are additionally illustrated. Under the graph, there is a table listing a frequency and a reflection coefficient at each marker in the graph (e.g., at a marker M* where "*" denotes a numerical value subsequent to "M" in the graph).

As seen from FIG. 9, in any of the case (ii) where the filter in the posterior stage is connected to the output side of the multiplexer 14 and the case (iii) where the switch 21D with the common terminal being in the OPEN condition is connected to the output side of the multiplexer 14, the reflection coefficient at frequencies outside the pass band (about 2496 MHz to about 2690 MHz) of the HB filter 11D is increased from that in the case (i) where the output side of the multiplexer 14 is terminated with 50 Ω. Such an increase of the reflection coefficient is particularly significant in the pass band (about 1475.9 MHz to about 2025 MHz) of the MLB/LMB filter 11A.

Thus, the following characteristics are provided when the filter 13A including the pass band within the pass band of the MLB/LMB filter 11A (e.g., the filter including the pass band B3) is connected to the above-described multiplexer 14.

Figure 10:
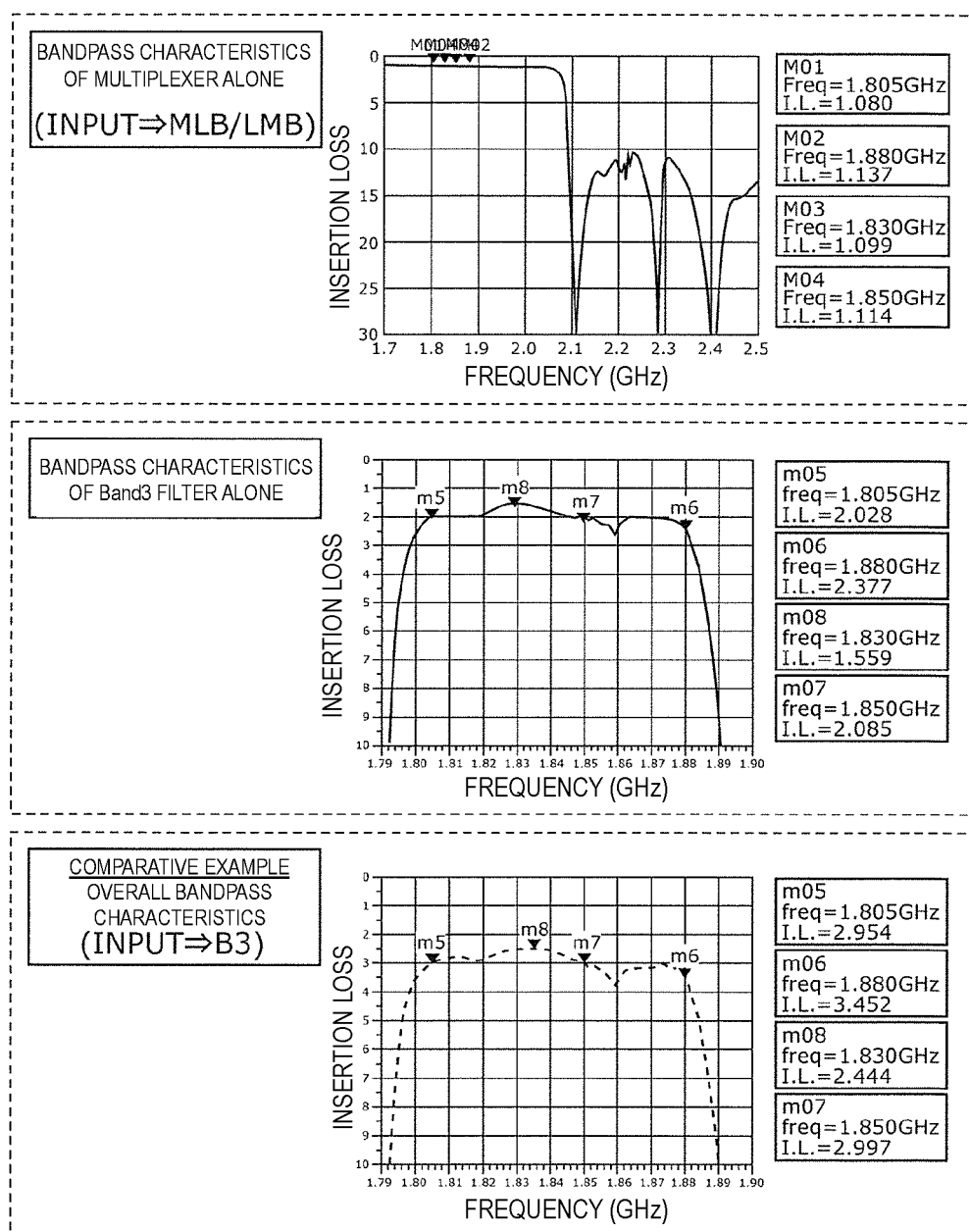
FIG. 10 is a graph representing characteristics of a radio frequency front-end circuit according to the Comparative Example corresponding to the Preferred Embodiment Example.

FIG. 10 is a graph representing characteristics of a radio frequency front-end circuit according to the Comparative Example corresponding to the Preferred Embodiment Example. More specifically, FIG. 10 represents, in order starting from above, a diagram of the radio frequency front-end circuit with which plotted bandpass characteristics are provided, bandpass characteristics of the multiplexer 14 alone (specifically, bandpass characteristics of the MLB/LMB filter 11A), bandpass characteristics of the filter 13A (Band3 filter) alone, and overall bandpass characteristics of the radio frequency front-end circuit in the Comparative Example.

In the graphs representing the bandpass characteristics, markers are additionally illustrated. At the right side in each graph, a frequency and an insertion loss (I.L.) at each marker in the graph (e.g., at a marker M* or m* where "*" denotes a numerical value subsequent to "M" or "m" in the graph) are also indicated. The above point is similarly applied to FIG. 11.

Figures 11, 12:
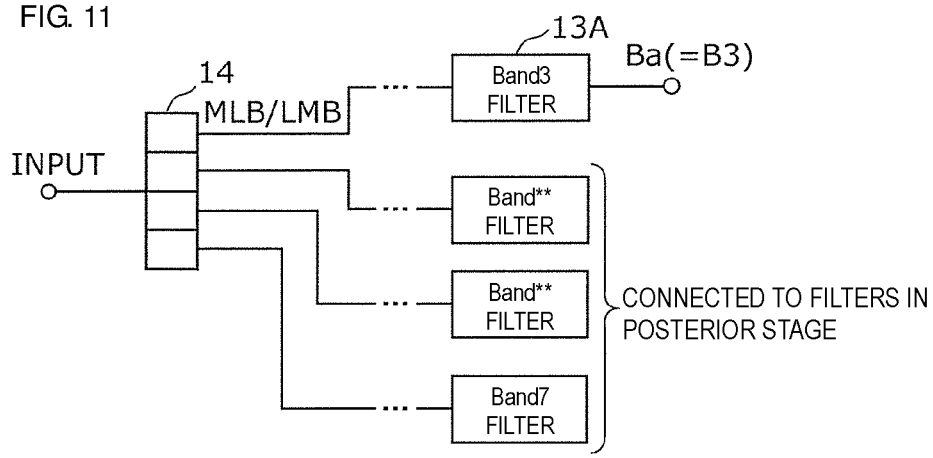
FIG. 11 is a graph representing characteristics of a radio frequency front-end circuit according to the Preferred Embodiment Example.
FIG. 12 is a table denoting an improvement in bandpass characteristics of the radio frequency front-end circuit according to the Preferred Embodiment Example in comparison with the Comparative Example.

FIG. 11 is a graph representing characteristics of the radio frequency front-end circuit 2 according to the Preferred Embodiment Example. More specifically, FIG. 11 represents, in order starting from above, a diagram of the radio frequency front-end circuit 2 with which plotted bandpass characteristics are provided, and overall bandpass characteristics of the radio frequency front-end circuit 2.

In the graph of FIG. 11 representing the bandpass characteristics, the bandpass characteristics of the Comparative Example illustrated in FIG. 10, denoted by a dotted line are also plotted in addition to the bandpass characteristics of the Preferred Embodiment Example, denoted by a solid line. In the circuit diagram of FIG. 11, the filters in the posterior stage other than the filter 13A are denoted by Band** filters, and those filters in the posterior stage are each an acoustic wave filter in which a resonator at the start position is a serial arm resonator. More specifically, those filters in the posterior stage correspond to the filters 13F to 13H, 13J and 13K.

Here, the radio frequency front-end circuit 2 according to the Preferred Embodiment Example is different from the radio frequency front-end circuit according to the Comparative Example only on the output side of the multiplexer 14. Thus, the characteristics of the multiplexer 14 alone and the characteristics of the filter 13A alone in the Preferred Embodiment Example are the same as or similar to those in the Comparative Example.

FIG. 12 is a table denoting an improvement in the bandpass characteristics of the radio frequency front-end circuit 2 according to the Preferred Embodiment Example in comparison with that in the Comparative Example. More specifically, the table denotes a loss (insertion loss) in the multiplexer 14 alone, a loss in the filter 13A (Band3 filter) alone, an overall loss in the radio frequency front-end circuit, and an overall loss improvement in the radio frequency front-end circuit 2 according to the Preferred Embodiment Example with respect to the Comparative Example at each of frequencies assigned to the markers in FIGS. 11 and 12.

As seen from FIGS. 10 to 12, with the radio frequency front-end circuit 2 according to the Preferred Embodiment Example, the loss in the path of a radio frequency signal propagating through the multiplexer 14 and the filter 13A is able to be significantly improved (e.g., significantly reduced or prevented) in comparison with the total loss in the multiplexer 14 alone and the filter 13A alone (e.g., in the Comparative Example in FIG. 12).

More specifically, in the Comparative Example, among the plurality of filters (e.g., the MLB/LMB filter 11A, the MB filter 11B, the MHB filter 11C, and the HB filter 11D) defining the multiplexer 14, the output sides of the filters other than the MLB/LMB filter 11A connected to the filter 13A are each terminated with 50 Ω. Therefore, the reflection coefficient at frequencies in the pass band (about 1475.9 MHz to about 2025 MHz) of the MLB/LMB filter 11A is low when looking at those other filters from the input side of the multiplexer 14.

On the other hand, in the Preferred Embodiment Example, the acoustic wave filter in which the resonator at the start position is the serial arm resonator is connected to each of the output side of the filters among the plurality of filters defining the multiplexer 14 other than the filter 11A, e.g., the MLB/LMB filter 11A, connected to the filter 13A. Therefore, the reflection coefficient at frequencies in the pass band of the MLB/LMB filter 11A when looking at those other filters from the input side of the multiplexer 14 is able to be increased in comparison with that in the Comparative Example. Thus, the radio frequency signal in the MLB/LMB band input to the multiplexer 14 is able to be significantly reduced or prevented from leaking to the other filters than the MLB/LMB filter 11A. Stated in another way, the bandpass characteristics of the MLB/LMB filter 11A are able to be significantly improved with the significant improvement of the attenuation characteristics of the other filters. As a result, looking at the entirety of the radio frequency front-end circuit 2, the bandpass characteristics are able to be significantly improved in Band3 that falls within the pass band (about 1475.9 MHz to about 2025 MHz) of the MLB/LMB filter 11A.

The radio frequency front-end circuit 2X according to one of the preferred embodiments of the present invention has been described above in connection with the radio frequency front-end circuit 2 according to the Preferred Embodiment Example. The features provided by the radio frequency front-end circuit 2X will be described below with reference to FIG. 1. Although the radio frequency front-end circuit 2X includes a plurality of sets each including the filter in the initial stage (e.g., the first acoustic wave filter), the switch, and the plurality of filters in the posterior stage (e.g., the second acoustic wave filters), features and elements of the individual sets are the same except for features associated with a point that the pass bands corresponding to the sets are different from one another. Thus, for the sake of simplicity of explanation, the features provided by the set including the filter 11a (e.g., the filter in the initial stage), the switch 21a (e.g., the switch), and the filters 13a and 13b (e.g., the filters in the posterior stage) are described below, and description of the features provided by the other sets is omitted.

According to the present preferred embodiment, as described above, the acoustic wave resonator (e.g., the first acoustic wave resonator) located closest to the switch 21a in the filter 11a (e.g., the first acoustic wave filter) defining the multiplexer 14X, and the acoustic wave resonator (e.g., the second acoustic wave resonator) located closest to the switch 21a in each of the filters 13a and 13b (e.g., the second acoustic wave filters) are each a serial arm resonator.

Therefore, when looking at the filter 11a from the side including the switch 21a, the impedance at frequencies outside the pass band of the filter 11*a* is capacitive in a region closer to OPEN on the Smith chart. Furthermore, when looking at each of the filters 13*a* and 13*b* from the side including the switch 21*a*, the impedance at frequencies outside the pass band of the filter 11*a* is also capacitive.

Accordingly, when the filter 11*a* and the filter 13*a* or 13*b* are connected to each other by the switch 21*a*, the reflection coefficient at frequencies outside the pass band of the filter 11*a* is able to be increased when viewed from a point at which the filters defining the multiplexer 14X are connected in common (namely, when viewed from the common connection point N in the preferred embodiment). Thus, the attenuation characteristics are able to be significantly improved in the filter 11*a* (specifically, in the path where the filter 11*a* is provided). Moreover, the bandpass characteristics are able to be significantly improved in the other filter lib defining the multiplexer 14X together with the filter 11*a* (specifically, in the path where the other filter 11*b* is provided).

As a result, the radio frequency front-end circuit 2X that is able to significantly improve the attenuation characteristics and the bandpass characteristics are able to be provided.

Furthermore, according to the present preferred embodiment, the impedance at the output terminal of the filter 11*a* (e.g., at the other terminal of the first acoustic wave filter) and the impedance at the input terminal of each of the filters 13*a* and 13*b* (e.g., at the switch-side terminal of the second acoustic wave filter) are both positioned in the right-half region on the Smith chart at frequencies outside the pass band of the filter 11*a*.

Accordingly, when the filter 11*a* and the filter 13*a* or 13*b* are connected to each other by the switch 21*a*, the impedance at frequencies outside the pass band of the filter 11*a* when looking at the side including the filters 13*a* and 13*b* from the output terminal of the filter 11*a* is able to be significantly reduced or prevented from shifting to the inductive region due to the influences of not only the wirings connecting the filter 11*a* and the filter 13*a* or 13*b*, but also the switch 21*a*. In other words, it is easier to keep the above-mentioned impedance in the capacitive region. Similarly, the impedance at frequencies outside the pass band of the filter 11*a* when looking at the side including the filter 11*a* from the input terminal of each of the filters 13*a* and 13*b* is able to also be significantly reduced or prevented from shifting to the inductive region.

Here, the input impedance and the output impedance of the acoustic wave filter both each capacitive. Therefore, the output impedance of the filter 11*a* (e.g., the impedance at the other terminal of the first acoustic wave filter) and the input impedance of each of the filters 13*a* and 13*b* (e.g., the impedance at the switch-side terminal of the second acoustic wave filter) are both capacitive at frequencies outside the pass band of the filter 11*a*.

Thus, with the features described above, the impedance when looking at the side including the filters 13*a* and 13*b* from the output terminal of the filter 11*a* (e.g., from the other terminal of the first acoustic wave filter) and the input impedance of each of the filters 13*a* and 13*b* are both capacitive at frequencies outside the pass band of the filter 11*a*. Similarly, the impedance when looking at the side including the filter 11*a* from the input terminal of each of the filters 13*a* and 13*b* (e.g., from the switch-side terminal of the second acoustic wave filter) and the output impedance of the filter 11*a* are both capacitive in the right-half region on the Smith chart at frequencies outside the pass band of the filter 11*a*.

In other words, with the features described above, the radio frequency front-end circuit is less susceptible to a factor causing degradation of the attenuation characteristics at frequencies outside the pass band of the filter 11*a*, e.g., to a reversed relation in which one impedance is inductive and the other impedance is capacitive.

As a result, the attenuation characteristics and the bandpass characteristics are able to be further significantly improved with the above-described features.

Moreover, according to the present preferred embodiment, the impedance when looking at the switch 21*a* from the side including the filter 11*a* (e.g., the first acoustic wave filter) is capacitive in the non-connected state.

Therefore, even in the non-connected state, namely even when the filter 11*a* and the filter 13*a* or 13*b* are not connected to each other by the switch 21*a* (e.g., during the non-CA operation in the present preferred embodiment), the attenuation characteristics and the bandpass characteristics are able to be significantly improved as in the case where those filters are connected (e.g., during the CA operation in the present preferred embodiment).

It is to be noted that the impedance when looking at the switch 21*a* from the side including the filter 11*a* (e.g., the first acoustic wave filter) may be inductive in the non-connected state. Even with the features described above, the attenuation characteristics and the bandpass characteristics are able to be significantly improved in the connected state.

According to the present preferred embodiment, in the non-connected state, the off-state capacitance value of the switch 21*a* is equal or substantially equal to the capacitance value of the acoustic wave resonator located closest to the switch 21*a* in each of the filters 13*a* and 13*b* (e.g., to the capacitance value of the second acoustic wave resonator).

Therefore, even in the non-connected state, the bandpass characteristics of the other filter lib defining the multiplexer 14X together with the filter 11*a* (specifically, in the path where the other filter 11*b* is provided) are able to be significantly improved to such an extent as equal or substantially equal to that in the connected state.

In the non-connected state, the impedance when looking at the switch 21*a* from the side including the filter 11*a* may be different from the capacitance value of the acoustic wave resonator located closest to the switch 21*a* in each of the filters 13*a* and 13*b* (e.g., of the second acoustic wave resonator). Even with the features described above, the attenuation characteristics and the bandpass characteristics are able to be significantly improved in the connected state.

According to the present preferred embodiment, the capacitance value of the acoustic wave resonator located closest to the switch 21*a* in the filter 11*a* (e.g., of the first acoustic wave resonator, namely the serial arm resonator s11) is equal or substantially equal to the capacitance value of the acoustic wave resonator located closest to the switch 21*a* in each of the filters 13*a* and 13*b* (e.g., of the second acoustic wave resonator, namely the serial arm resonator s13).

With the feature described above, the impedance when looking at the filter 11*a* from the side including the switch 21*a* and the impedance when looking at each of the filters 13*a* and 13*b* from the side including the switch 21*a* is able to be positioned substantially in the same region or substantially the same region on the Smith chart at frequencies outside the pass band of the filter 11*a*. Accordingly, when the filter 11*a* and the filter 13*a* or 13*b* are connected to each other by the switch 21*a*, the reflection coefficient at frequencies outside the pass band of the filter 11*a* is able to be further increased when viewed from the point at which the filters defining the multiplexer 14X are connected in common (namely, when viewed from the common connection point N in the preferred embodiment). As a result, the attenuation characteristics and the bandpass characteristics are able to be further significantly improved.

The capacitance value of the serial arm resonator s11 and the capacitance value of the serial arm resonator s13 may be different from each other. With the features described above, the effect of significantly improving the attenuation characteristics and the bandpass characteristics is somewhat inferior to that in the case where the above-mentioned capacitance values are the same or substantially the same, but the attenuation characteristics and the bandpass characteristics are able to be significantly improved in comparison with the attenuation characteristics and the bandpass characteristics if a parallel arm resonator is included in place of at least one of the serial arm resonators s11 and s13.

According to the present preferred embodiment, the radio frequency front-end circuit includes the plurality of filters 13a and 13b (e.g., the plurality of second acoustic wave filters) connected to the switch 21a. Therefore, the radio frequency front-end circuit is able to be applied to a larger number of bands while the attenuation characteristics and the bandpass characteristics are significantly improved.

According to the present preferred embodiment, the radio frequency front-end circuit includes the plurality of sets each including the filter defining the multiplexer 14X, the switch connected to the relevant filter, and the plurality of filters connected to the relevant switch. Therefore, the radio frequency front-end circuit is able to be applied to a larger number of bands while the attenuation characteristics and the bandpass characteristics are significantly improved.

While the radio frequency front-end circuits according to the preferred embodiments of the present invention have been described above in connection with the preferred embodiments and the Preferred Embodiment Example, the present invention further includes not only modifications that are provided by variously modifying the above-described preferred embodiments and the Preferred Embodiment Example on the basis of ideas, which are conceivable by those skilled in the art, within the scope not departing from the gist of the present invention, but also a variety of devices, for example, a communication device, each incorporating the radio frequency front-end circuit according to various preferred embodiments of the present invention.

According to the communication device, the attenuation characteristics and the bandpass characteristics are able to be significantly improved because of incorporating the radio frequency front-end circuit.

At least one of the plurality of filters (e.g., the filters in the initial stage) defining the multiplexer may not be an acoustic wave filter, and it may be a dielectric filter or an LC filter as another example. Similarly, at least one of the filters in the posterior stage may not be an acoustic wave filter.

Neither switch nor filter may be connected to the output side of at least one of the plurality of filters defining the multiplexer.

In each of the first acoustic wave filter and the second acoustic wave filter, for example, an inductor or a capacitor may be connected, and a circuit element, for example, a resistance element, other than an inductor or a capacitor may be added between two terminals among the input/output terminals, the ground terminal, and so on.

For example, a hybrid filter provided by replacing at least one of one or more acoustic wave resonators defining each of the first acoustic wave filter and the second acoustic wave filter with a capacitance may be included as either one or both of the first acoustic wave filter and the second acoustic wave filter. In another example, a hybrid filter provided by combining one or more acoustic wave resonators with an LC filter, which is defined by either one or both of an inductor and a capacitor, may be included as the first acoustic wave filter and the second acoustic wave filter. In the case of including such a filter, a wide band and sharp attenuation are able to be provided at the same time or substantially the same time.

The preferred embodiments of the present invention are able to provide a radio frequency front-end circuit and a communication device, which are adaptable for multiband frequency standards and which ensure satisfactory attenuation characteristics and bandpass characteristics, and are able to be widely applied to communication equipment, for example, a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A radio frequency front-end circuit that is able to be included in a communication system that transmits, receives, or transmits and receives signals in a plurality of frequency bands at a same time or substantially the same time, the radio frequency front-end circuit comprising:
   a multiplexer including a plurality of filters with different pass bands from one another, the plurality of filters including a first acoustic wave filter and a first terminal of each of the plurality of filters being connected in common;
   a second acoustic wave filter including a pass band within a pass band of the first acoustic wave filter; and
   a switch including a common terminal connected to a second terminal of the first acoustic wave filter, and a plurality of selective terminals including a selective terminal connected to the second acoustic wave filter; wherein
   a first acoustic wave resonator of one or more acoustic wave resonators defining the first acoustic wave filter is a serial arm resonator and is located closest to the switch among the one or more acoustic wave resonators of the first acoustic wave filter; and
   a second acoustic wave resonator of one or more acoustic wave resonators defining the second acoustic wave filter is a serial arm resonator and is located closest to the switch among the one or more acoustic wave resonators of the second acoustic wave filter.

2. The radio frequency front-end circuit according to claim 1, wherein an impedance at the second terminal of the first acoustic wave filter and an impedance at a switch-side terminal of the second acoustic wave filter are both capacitive and positioned in a right-half region of a Smith chart at frequencies outside the pass band of the first acoustic wave filter.

3. The radio frequency front-end circuit according to claim 1, wherein an impedance when looking at the switch from a side including the first acoustic wave filter is capacitive and positioned in a right-half region of a Smith chart in a non-connected state where the common terminal is not connected to any of the plurality of selective terminals.

4. The radio frequency front-end circuit according to claim 3, wherein, in the non-connected state, an off-state capacitance value of the switch is equal or substantially equal to a capacitance value of the second acoustic wave resonator.

5. The radio frequency front-end circuit according to claim 1, wherein a capacitance value of the first acoustic wave resonator is equal or substantially equal to a capacitance value of the second acoustic wave resonator.

6. The radio frequency front-end circuit according to claim 1, wherein the radio frequency front-end circuit includes a plurality of second acoustic wave filters connected individually to the plurality of selective terminals and including different pass bands from one another.

7. The radio frequency front-end circuit according to claim 6, wherein
the radio frequency front-end circuit includes a plurality of sets each including the first acoustic wave filter, the switch, and the plurality of second acoustic wave filters; and
each of the plurality of first acoustic wave filters is connected in common at a first terminal thereof, includes different pass bands from one another, and defines the multiplexer.

8. The radio frequency front-end circuit according to claim 7, wherein at least one of the first acoustic wave filter and the second acoustic wave filter is a bulk acoustic wave filter.

9. The radio frequency front-end circuit according to claim 7, wherein the first acoustic wave filter is a hybrid filter.

10. The radio frequency front-end circuit according to claim 1, wherein the plurality of filters of the multiplexer include:
an MLB/LMB filter including a pass band of about 1475.9 MHz to about 2025 MHz;
an MB filter including a pass band of about 2110 MHz to about 2200 MHz;
an MHB filter including a pass band of about 2300 MHz to about 2400 MHz; and
an HB filter including a pass band of about 2496 MHz to about 2690 MHz.

11. The radio frequency front-end circuit according to claim 1, wherein
the radio frequency front-end circuit includes a plurality of sets each including the first acoustic wave filter, the second acoustic wave filter, and the switch;
each of the plurality of first acoustic wave filters is connected in common at a first terminal thereof, includes different pass bands from one another, and defines the multiplexer that is a first multiplexer; and
the radio frequency front-end circuit further includes a second multiplexer connected to a stage anterior to the first multiplexer.

12. The radio frequency front-end circuit according to claim 11, wherein at least one of filters of the second multiplexer is a hybrid filter.

13. The radio frequency front-end circuit according to claim 11, wherein the second multiplexer is a diplexer.

14. The radio frequency front-end circuit according to claim 11, wherein the second multiplexer is a triplexer.

15. The radio frequency front-end circuit according to claim 14, wherein the triplexer includes:
an LB filter including a pass band of about 699 MHz to about 960 MHz;
an MB filter including a pass band of about 1427 MHz to about 2200 MHz; and
an HB filter including a pass band of about 2300 MHz to about 2690 MHz.

16. The radio frequency front-end circuit according to claim 11, wherein the other multiplexer is a quadplexer.

17. The radio frequency front-end circuit according to claim 16, wherein the quadplexer includes:
an LB filter including a pass band of about 699 MHz to about 960 MHz;
an MB filter including a pass band of about 1427 MHz to about 2200 MHz;
an HB1 filter including a pass band of about 2300 MHz to about 2400 MHz; and
an HB2 filter including a pass band of about 2496 MHz to about 2690 MHz.

18. A communication device comprising:
an RF signal processing circuit that processes radio frequency signals transmitted, received, or transmitted and received via an antenna element; and
the radio frequency front-end circuit according to claim 1, the radio frequency front-end circuit transferring the radio frequency signals between the antenna element and the RF signal processing circuit.

* * * * *